US008634946B2

(12) United States Patent
Scharrer et al.

(10) Patent No.: US 8,634,946 B2
(45) Date of Patent: Jan. 21, 2014

(54) APPARATUS AND METHOD FOR CALCULATING A FINGERPRINT OF AN AUDIO SIGNAL, APPARATUS AND METHOD FOR SYNCHRONIZING AND APPARATUS AND METHOD FOR CHARACTERIZING A TEST AUDIO SIGNAL

(75) Inventors: Sebastian Scharrer, Ruckersdorf (DE); Wolfgang Fiesel, Schwanstetten Sued (DE); Matthias Neusinger, Rohr (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 634 days.

(21) Appl. No.: 12/867,460

(22) PCT Filed: Feb. 10, 2009

(86) PCT No.: PCT/EP2009/000917
§ 371 (c)(1),
(2), (4) Date: Nov. 4, 2010

(87) PCT Pub. No.: WO2009/100875
PCT Pub. Date: Aug. 20, 2009

(65) Prior Publication Data

US 2011/0112669 A1 May 12, 2011

(30) Foreign Application Priority Data

Feb. 14, 2008 (DE) ......................... 10 2008 009 025

(51) Int. Cl.
*G06F 17/00* (2006.01)
*H03M 9/00* (2006.01)
*H03M 1/00* (2006.01)
*H04K 1/02* (2006.01)

(52) U.S. Cl.
USPC .............. 700/94; 341/101; 341/142; 380/253

(58) Field of Classification Search
CPC ...... G10L 19/008; H04S 3/008; H03M 3/388; H04H 60/37; H04N 21/2335; H04L 27/261; H04L 27/2611
USPC ............ 700/94; 341/101, 120, 142, 151, 899; 380/253; 386/331
See application file for complete search history.

(56) References Cited

U.S. PATENT DOCUMENTS

2004/0148159 A1* 7/2004 Crockett et al. .............. 704/211
2005/0177372 A1* 8/2005 Wang et al. ................... 704/273

(Continued)

FOREIGN PATENT DOCUMENTS

DE 102004046746 B4 3/2007
EP 1760693 3/2007

(Continued)

OTHER PUBLICATIONS

Herre, J. et al.; "Spatial Audio Coding: Next-generation efficient and compatible coding of multi-channel audio"; Oct. 2004; Prepring 6186 Presented at the 117th Convention, AES, San Francisco, CA, 13 pages.

(Continued)

*Primary Examiner* — Jesse Elbin
(74) *Attorney, Agent, or Firm* — Michael A. Glenn; Perkins Coie LLP

(57) ABSTRACT

For calculating a fingerprint of an audio signal, the audio signal is divided into subsequent blocks of samples. For the subsequent blocks, one fingerprint value each is calculated, wherein fingerprint samples of subsequent blocks are compared. Based on whether the fingerprint value of a block is higher than the fingerprint value of a subsequent block or not, a binary value is assigned, wherein information about a sequence of binary values is output as fingerprint for the audio signal.

15 Claims, 9 Drawing Sheets

(56) References Cited

U.S. PATENT DOCUMENTS

| | | | | |
|---|---|---|---|---|
| 2007/0217626 | A1* | 9/2007 | Sharma et al. | 381/100 |
| 2007/0285815 | A1 | 12/2007 | Herre et al. | |
| 2008/0013614 | A1 | 1/2008 | Fiesel et al. | |
| 2009/0150161 | A1* | 6/2009 | Faller | 704/500 |
| 2009/0157391 | A1 | 6/2009 | Bilobrov | |
| 2009/0167942 | A1* | 7/2009 | Hoogenstraaten et al. | 348/500 |

FOREIGN PATENT DOCUMENTS

| | | |
|---|---|---|
| GB | 2431837 | 5/2007 |
| JP | 200765659 | 3/2007 |
| JP | 2007171933 | 7/2007 |
| WO | WO-2006018747 | 2/2006 |
| WO | WO-2006034825 | 4/2006 |
| WO | WO 2006/102991 | 10/2006 |

OTHER PUBLICATIONS

Doets, P.J.O. et al.; " on the comparison of audio fingerprings for extracting quality parameters of compressed audio"; Feb. 2006; Proceedings of SPIE, vol. 6072, pp. 228-239, San Jose, CA.

English Translation of the International Preliminary Report on Patentability dated Oct. 29, 2010 in parallel application PCT/EP2009/000917, 7 pages.

International Search Report mailed Jul. 31, 2009 in parallel application PCT/EP2009/000917, 3 pages.

* cited by examiner

APPARATUS AND METHOD FOR CALCULATING A FINGERPRINT OF AN AUDIO SIGNAL, APPARATUS AND METHOD FOR SYNCHRONIZING AND APPARATUS AND METHOD FOR CHARACTERIZING A TEST AUDIO SIGNAL

CROSS-REFERENCE TO RELATED APPLICATION

This application is a U.S. National Phase entry of PCT/EP2009/000917 filed Feb. 10, 2009, and claims priority to German Patent Application No. 102008009025.5 filed Feb. 14, 2008, each of which is incorporated herein by references hereto.

BACKGROUND OF THE INVENTION

The present invention relates to the fingerprint technology for audio signals and in particular to calculating a fingerprint, using a fingerprint for synchronizing multichannel extension data with an audio signal and characterizing an audio signal with the fingerprint.

Currently developed technologies allow an ever more efficient transmission of audio signals by data reduction, but also an increase of audio enjoyment by extensions, such as by the usage of multichannel technology.

Examples for such an extension of common transmission techniques have become known under the name of "Binaural Cue Coding" (BCC) as well as "Spatial Audio Coding". Regarding this, reference is made exemplarily to J. Herre, C. Faller, S. Disch, C. Ertel, J. Hilpet, A. Hoelzer, K. Linzmeier, C. Spenger, P. Kroon: "Spatial Audio Coding: Next-Generation Efficient and Compatibel Coding Oberfläche Multi-Channel Audio", 117$^{th}$ AES Convention, San Francisco 2004, Preprint 6186.

In a sequentially operating transmission system, such as radio or Internet, such methods separate the audio program to be transmitted into audio base data or an audio signal, which can be a mono or also a stereo downmix audio signal, and into extension data that can also be referred to as multichannel additional information or multichannel extension data. The multichannel extension data can be broadcast together with the audio signal, i.e. in a combined manner, or the multichannel extension data can also be broadcast separately from the audio signal. As an alternative to broadcasting a radio program, the multichannel extension data can also be transmitted separately, for example to a version of the downmix channel already existing on the user side. In this case, transmission of the audio signal, for example in the form of an interne download or a purchase of a compact disc or DVD takes place spatially and temporally separate from the transmission of the multichannel extension data, which can be provided, for example, from a multichannel extension data server.

Basically, the separation of a multichannel audio signal into an audio signal and multichannel extension data has the following advantages. A "classic" receiver is able to receive and replay audio base data, i.e. the audio signal at any time, independent of content and version of the multichannel additional data. This characteristic is referred to as reverse compatibility. In addition to that, a receiver of the newer generation can evaluate the transmitted multichannel additional data and combine the same with the audio base data, i.e. the audio signal, in such a manner that the complete extension, i.e. the multichannel sound, can be provided to the user.

In an exemplary application scenario in digital radio, with the help of these multichannel extension data, the previously broadcast stereo audio signal can be extended to the multichannel format 5.1 with little additional transmission effort. The multichannel format 5.1 comprises five replay channels, i.e. a left channel L, a right channel R, a central channel C, a left rear channel LS (left surround) and a right rear channel RS (right surround). For this, the program provider generates the multichannel additional information on the transmitter side from multichannel sound sources, such as they are found, for example, on a DVD/audio/video. Subsequently, this multichannel additional information can be transmitted in parallel to the audio stereo signal broadcast as before, which now includes a stereo downmix of the multichannel signal.

One advantage of this method is the compatibility with the so far existing digital radio transmission system. A classical receiver that cannot evaluate this additional information will be able to receive and replay the two-channel sound signal as before without any limitations regarding quality.

A receiver of novel design, however, can evaluate and decode the multichannel information and reconstruct the original 5.1 multichannel signal from the same, in addition to the stereo sound signal received so far.

For allowing simultaneous transmission of the multichannel additional information as a supplement to the stereo sound signal used so far, two solutions are possible for compatible broadcast via a digital radio system.

The first solution is to combine the multichannel additional information with the coded downmix audio signal such that they can be added to the data stream generated by an audio encoder as a suitable and compatible extension. In this case, the receiver only sees one (valid) audio data stream and can again, synchronously to the associated audio data block, extract and decode the multichannel additional information by means of a correspondingly preceding data distributor and output the same as a 5.1 multichannel sound.

This solution necessitates the extension of the existing infrastructure/data paths, such that they can now transport the data signals consisting of downmix signals and extension instead of merely the stereo audio signals as before. This is, for example, possible without additional effort, or unproblematic, when it is a data-reduced illustration, i.e. a bit stream transmitting the downmix signals. A field for the extension information can then be inserted into this bit stream.

A second possible solution is to couple the multichannel additional information not to the used audio coding system. In this case, the multichannel extension data are not coupled into the actual audio data stream. Instead, transmission is performed via a specific but not necessarily temporarily synchronized additional channel, which can, for example, be a parallel digital additional channel. Such a situation occurs, for example, when the downmix data, i.e. the audio signal, are routed through a common audio distribution infrastructure existing in studios in unreduced form, e.g. as PCM data per AES/EBU data format. These infrastructures are aimed at distributing audio signals digitally between various sources ("crossbars") and/or processing them, for example by means of sound regulation, dynamic compression, etc.

In the second possible solution described above, the problem of time offset of the downmix audio signal and multichannel additional information in the receiver can occur, since both signals pass through different, non-synchronized data paths. A time offset between downmix signal and additional information, however, causes deterioration of the sound quality of the reconstructed multichannel signal, since then an audio signal with multichannel extension data, which actually do not belong to the current audio signal but to an earlier or later portion or block of the audio signal, is processed on the replay side.

Since the order of magnitude of the time offset can no longer be determined from the received audio signal and the additional information, a time-correct reconstruction and association of the multichannel signal in the receiver is not ensured, which will result in quality losses.

A further example for this situation is when an already running 2-channel transmission system is to be extended to multichannel transmission, for example when considering a receiver for digital radio. Here, it is often the case that decoding of the downmix signal frequently takes place by means of an audio decoder already existing in the receiver, which means, for example, a stereo audio decoder according to the MPEG 4 standard. The delay time of this audio decoder is not known or cannot be predicted exactly, due to the system-immanent data compression of audio signals. Hence, the delay time of such an audio decoder cannot be compensated reliably.

In the extreme case, the audio signal can also reach the multichannel audio decoder via a transmission chain including analog parts. Here, digital/analog conversion takes place at a certain point in the transmission, which is followed again by analog/digital conversion after a further storage/transmission. Here also, no indications are available as to how a suitable delay compensation of the downmix signal in relation to the multichannel additional data can be performed. When the sampling frequency for the analog/digital conversion and the digital/analog conversion differ slightly, even a slow time drift of the necessitated compensation delay results according to the ratio of the two sampling rates to each other.

German patent DE 10 2004 046 746 B4 discloses a method and an apparatus for synchronizing additional data and base data. A user provides a fingerprint based on his stereo data. An extension data server identifies the stereo signal based on the obtained fingerprint and accesses a database for retrieving the extension data for this stereo signal. In particular, the server identifies an ideal stereo signal corresponding to the stereo signal existing at the user and generates two test fingerprints of the ideal audio signal belonging to the extension data. These two test fingerprints are then provided to the client who determines a compression/expansion factor and a reference offset therefrom, wherein, based on the reference offset, the additional channels are expanded/compressed and cut off at the beginning and the end. Thereupon, a multichannel file can be generated by using the base data and the extension data.

Generally speaking, fingerprint technologies have to be characteristic for an audio signal. On the other hand, they should also be an equally highly compressed representation of an audio signal. This means that the fingerprint may use up significantly less memory space than the audio signal itself, since otherwise generating a fingerprint and using a fingerprint would be useless.

On the other hand, a fingerprint should reproduce the time curve of an audio signal in order to be suitable, on the one hand, for synchronization purposes and, on the other hand, also for identification purposes. In particular with regard to identification or characterization purposes, there is frequently the situation that an audio signal, such as a radio transmission, does not fully replay an audio piece, but starts transmitting at a certain time in the piece and possibly even stops transmitting before the piece has ended. However, the fingerprint does not need to be decompressable since fingerprint generation can be considered as a particularly lossy compression.

Since fingerprint information is additional information, it should, as mentioned above, be a representation that is as compressed as possible but nevertheless characteristic. It is a further advantage of the compressed representation that the more compressed the representation is, the faster and easier to handle any correlations will be performed, i.e. calculation methods where a fingerprint is involved, e.g. for synchronizing or characterizing an audio signal.

SUMMARY

According to an embodiment, an apparatus for synchronizing multichannel extension data with an audio signal, wherein the multichannel extension data are associated with reference audio signal fingerprint information, may have: a fingerprint calculator for calculating a fingerprint of the audiosignal having: a means for dividing the audio signal into subsequent blocks of samples; a means for calculating a first fingerprint value for a first block of the subsequent blocks and a second fingerprint value for a second block of the subsequent blocks; a means for comparing the first fingerprint value with the second fingerprint value; a means for assigning a first binary value when the first fingerprint value is higher than the second fingerprint value, or a second different binary value when the first fingerprint value is smaller than the second fingerprint value; and a means for outputting information about a sequence of binary values as fingerprint for the audio signal; a fingerprint extractor for extracting a sequence of reference audio signal fingerprints from the reference audio signal fingerprint information associated with the multichannel extension data; wherein the sequence of test audio signal fingerprints and the sequence of reference audio signal fingerprints are each a sequence of 1-bit values, wherein one bit each is associated with one block of audio samples, a fingerprint correlator for correlating the sequence of test audio signal fingerprints and the sequence of reference audio signal fingerprints, wherein the fingerprint correlator is implemented to combine a bit sequence of the sequence of test audio signal fingerprints and a bit sequence of the reference audio signal fingerprints by a bit-by-bit XOR operation, and to sum up obtained bit results in order to obtain a first correlation value, to further combine a bit sequence of the sequence of test audio signal fingerprints or the reference audio signal fingerprints shifted by an offset value with a respectively different sequence by a bit-by-bit XOR operation, and to sum up obtained bit results in order to obtain a second correlation value, and to select that offset value as the correlation result for which the largest correlation value has resulted; and a compensator for reducing or eliminating a time offset between the multichannel extension data and the audio signal based on the correlation result.

According to another embodiment, an apparatus for characterizing a test audio signal may have: a means for calculating a test fingerprint of the test audio signal having: a means for dividing the audio signal into subsequent blocks of samples; a means for calculating a first fingerprint value for a first block of the subsequent blocks and a second fingerprint value for a second block of the subsequent blocks; a means for comparing the first fingerprint value with the second fingerprint value; a means for assigning a first binary value when the first fingerprint value is higher than the second fingerprint value, or a second different binary value when the first fingerprint value is smaller than the second fingerprint value; and a means for outputting information about a sequence of binary values as fingerprint for the audio signal; a means for correlating the information about the sequence of binary values with difference reference fingerprints in a reference database, wherein the reference database includes information about an audio signal for every reference fingerprint, which is associated to the reference fingerprint; and wherein the sequence of test audio signal fingerprints and the sequence of reference audio signal fingerprints are each a sequence of 1-bit values, wherein one bit each is associated with one block of audio samples, wherein the means for correlating is implemented to combine a bit sequence of the sequence of test audio signal fingerprints and a bit sequence of the reference audio signal fingerprints by a bit-by-bit XOR operation, and to sum up obtained bit results in order to obtain a first correlation value, to further combine a bit sequence of the sequence of test audio signal fingerprints or the reference audio signal fingerprints shifted by an offset value with a respectively different sequence by a bit-by-bit XOR operation, and to sum up obtained bit results in order to obtain a second correlation value, and to select that offset value as the correlation result for which the largest correlation value has resulted, a means for providing information about the test audio signal based on the correlation result.

According to another embodiment, a method for synchronizing multichannel extension data with an audio signal, wherein the multichannel extension data are associated with the reference audio signal fingerprint information, may have the steps of: calculating a fingerprint of an audio signal, having: dividing the audio signal into subsequent blocks of samples; calculating a first fingerprint value for a first block of the subsequent blocks and a second fingerprint value for a second block of the subsequent blocks; comparing the first fingerprint value with the second fingerprint value; assigning a first binary value when the first fingerprint value is higher than the second fingerprint value, or a second different binary value when the first fingerprint value is smaller than the second fingerprint value; and outputting information about a sequence of binary values as fingerprint for the audio signal; extracting a sequence of reference audio signal fingerprints from the reference audio signal fingerprint information associated with the multichannel extension data; wherein the sequence of test audio signal fingerprints and the sequence of reference audio signal fingerprints are each a sequence of 1-bit values, wherein one bit each is associated with one block of audio samples, correlating the sequence of test audio signal fingerprints and the sequence of reference audio signal fingerprints, the correlating having: combining a bit sequence of the sequence of test audio signal fingerprints and a bit sequence of the reference audio signal fingerprints by a bit-by-bit XOR operation, and to sum up obtained bit results in order to obtain a first correlation value, combining a bit sequence of the sequence of test audio signal fingerprints or the reference audio signal fingerprints shifted by an offset value with a respectively different sequence by a bit-by-bit XOR operation, and to sum up obtained bit results in order to obtain a second correlation value, and selecting that offset value as the correlation result for which the largest correlation value has resulted; and reducing or eliminating a time offset between the multichannel extension data and the audio signal based on the correlation result.

According to another embodiment, a method for characterizing a test audio signal may have the steps of: calculating a test fingerprint of an audio signal, having: dividing the audio signal into subsequent blocks of samples; calculating a first fingerprint value for a first block of the subsequent blocks and a second fingerprint value for a second block of the subsequent blocks; comparing the first fingerprint value with the second fingerprint value; assigning a first binary value when the first fingerprint value is higher than the second fingerprint value, or a second different binary value when the first fingerprint value is smaller than the second fingerprint value; and outputting information about a sequence of binary values as fingerprint for the audio signal, wherein a sequence of binary values is obtained as test fingerprint; wherein the sequence of test audio signal fingerprints and the sequence of reference audio signal fingerprints are each a sequence of 1-bit values, wherein one bit each is associated with one block of audio samples, correlating the information about a sequence of binary values with different reference fingerprints in a reference database, wherein the reference database includes, for every reference finger print, information about an audio signal associated with the reference fingerprint, the correlating having: combining a bit sequence of the sequence of test audio signal fingerprints and a bit sequence of the reference audio signal fingerprints by a bit-by-bit XOR operation, and to sum up obtained bit results in order to obtain a first correlation value, combining a bit sequence of the sequence of test audio signal fingerprints or the reference audio signal fingerprints shifted by an offset value with a respectively different sequence by a bit-by-bit XOR operation, and to sum up obtained bit results in order to obtain a second correlation value, and selecting that offset value as the correlation result for which the largest correlation value has resulted; and providing information about the test audio signal based on the correlation result.

Another embodiment may have a computer program having a program code for performing the inventive method for synchronizing multichannel extension data with an audio signal and the inventive method for characterizing a test audio signal, when the program runs on a computer.

The present invention is based on the knowledge that a well-compressed fingerprint is obtained by block processing an audio signal, i.e. that one fingerprint value is derived per block of the audio signal. Further, it has been found out that a course of this fingerprint value from block to block is particularly characteristic for the audio signal. Hence, in the sense of differential coding, a comparison of subsequent fingerprint values is performed for subsequent blocks to then merely binarily characterize the change. If the first fingerprint value is higher than the second fingerprint value, a first binary value will be assigned, while if the second fingerprint value is higher than the first fingerprint value, another second binary value will be assigned. This sequence of binary values is output as a fingerprint for the audio signal. This change is quantized by merely one single bit. By this 1-bit quantization, merely one single bit of fingerprint information is provided per block of the audio signal, and the audio signal is represented by a simple bit sequence, by which a fast, efficient and surprisingly exact correlation with a corresponding test bit sequence can be performed.

Audio signals have the property that the characteristics do not change so much from block to block, so that a full, e.g., 8-bit quantization or 16-bit quantization of the fingerprint value is not absolutely necessitated. Further, audio signals have the property that a change of the fingerprint value from one block to the next is very expressive for the audio signal. By the 1-bit quantization, this change from one block to the next is strongly emphasized. In this way, audio signals have in particular the characteristic that the fingerprint value does not change very much from one block to the next. However, the characterization information for the audio signal that is particularly necessitated for fingerprint processing purposes, which is effectively used by the inventive 1-bit quantization, is embedded within this little change.

In particular when the fingerprint value is an energy-dependent or power-dependent value, changes from one block to the next are relatively small, wherein, however, particularly when blocks are formed in the range of less than 5,000 samples and in particular of less than 2,00 samples and blocks of more than 500 samples, the change of the energy-dependent or power-dependent value from one block to the next is particularly characteristic for the audio signal.

The inventive fingerprint can be used in a particularly favorable manner for the synchronization of multichannel extension data with an audio signal, wherein synchronization is achieved efficiently and reliably by means of a block-based fingerprint technology.

It has been found out that fingerprints calculated block-by-block represent a good and efficient characteristic for an audio signal. However, in order to bring the synchronization onto a level that is smaller than one block length, it is advantageous to provide the audio signal with block division information that is detected during synchronization and that can be used for fingerprint calculation.

The audio signal comprises block division information that can be used at the time of synchronization. Thereby, it is ensured that the fingerprints derived from the audio signal during synchronization are based on the same block division or block rasterization as the fingerprints of the audio signal associated with the multichannel extension data. In particular, the multichannel extension data comprise a sequence of reference audio signal fingerprint information. This reference audio signal fingerprint information provides an association, inherent in the multichannel extension stream, between a block of multichannel extension data and the portion or block of the audio signal to which the multichannel extension data belong.

For synchronization, the reference audio signal fingerprints are extracted from the multichannel extension data and correlated with the test audio signal fingerprints calculated by the synchronizer. The correlator merely has to achieve block correlation, since, due to using block division information, the block rasterization on which the two sequences of fingerprints are based is already identical.

Thereby, despite the fact that merely fingerprints sequences have to be correlated on block level, an almost sample-exact synchronization of the multichannel extension data with the audio signal can be obtained.

The block division information included in the audio signal can be stated as explicit side information, e.g. in a header of the audio signal. Alternatively, even when a digital but uncompressed transmission exists, this block division information can also be included in a sample which was, for example, the first sample of a block that was formed for calculating the reference audio signal fingerprints contained in the multichannel extension data. Alternatively or additionally, the block division information can also be introduced directly into the audio signal itself, e.g. by means of watermark embedding. A pseudo noise sequence is particularly suited for this, however, different ways of watermark embeddings can be used for introducing block division information into the audio signal. An advantage of this watermark implementation is that any analog/digital or digital/analog conversions are uncritical. Further, watermarks that are robust against data compression exist, which will even withstand compression/decompression or even tandem/coding stages and which can be used as reliable block division information for synchronization purposes.

In addition to that, it is advantageous to embed the reference audio signal fingerprint information directly block by block into the data stream of the multichannel extension data. In this embodiment, finding an appropriate time offset is achieved by using a fingerprint with a data fingerprint not stored separately from the multichannel extension data. Instead, for every block of the multichannel extension data, the fingerprint is embedded in this block itself Alternatively, however, the reference audio signal fingerprint information can be associated with the multichannel extension data but originate from a separate source.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
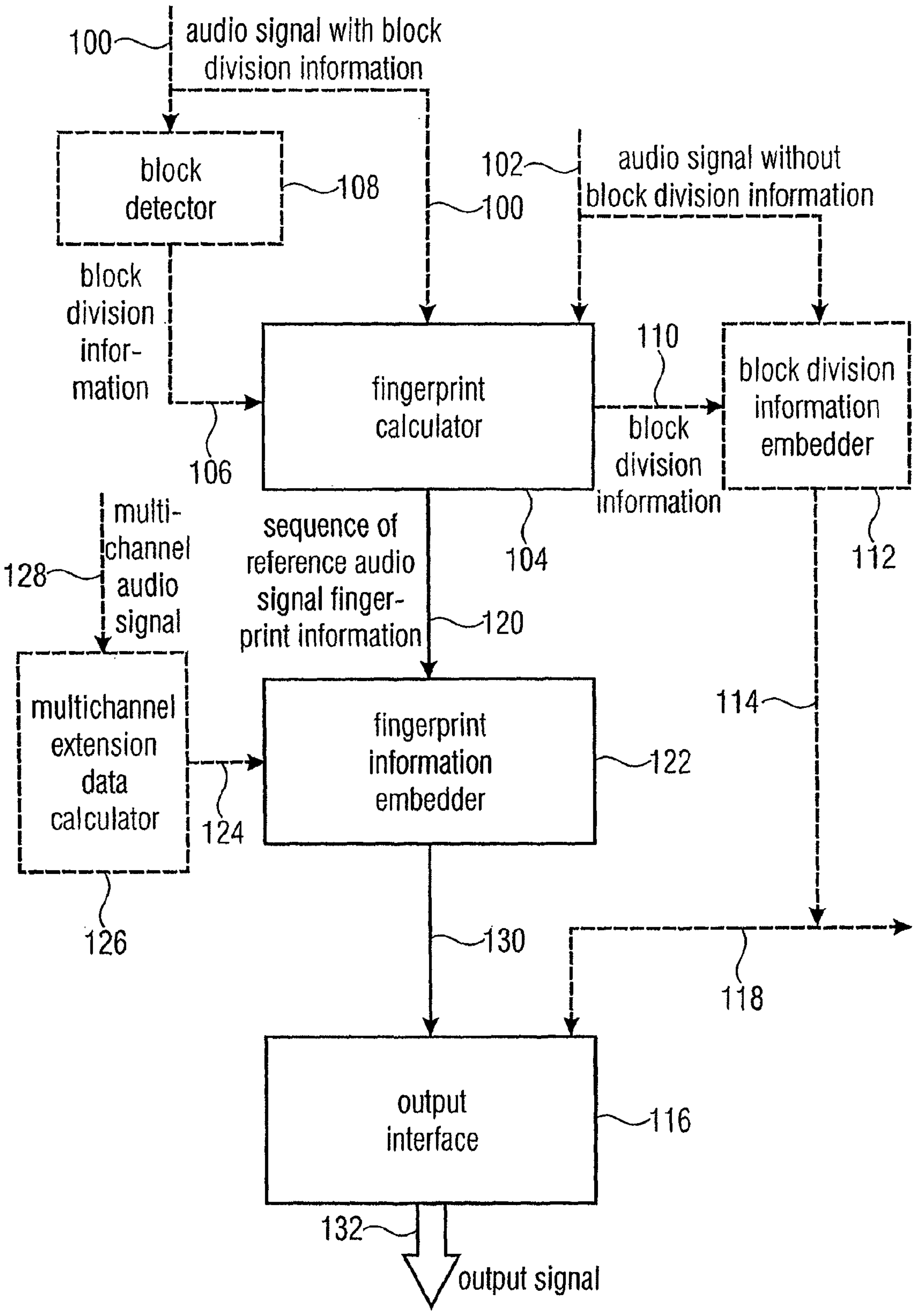
FIG. 1 is a block diagram of an apparatus for processing the audio signal for providing a synchronizable output signal with multichannel extension data, according to an embodiment of the invention.

FIG. 1 shows a schematic diagram of an apparatus for processing an audio signal, wherein the audio signal is shown at 100 with block division information, while the audio signal at 102 may comprise no block division information. The apparatus for processing an audio signal of FIG. 1, which can be used in an encoder scenario, which will be detailed with regard to FIG. 9, comprises a fingerprint calculator 104 for calculating one fingerprint per block of the audio signal for a plurality of subsequent blocks for obtaining a sequence of reference audio signal fingerprint information. The fingerprint calculator is implemented to use predetermined block division information 106. The predetermined block division information 106 can, for example, be detected by a block detector 108 from the audio signal 100 with block division information. As soon as the block division information 106 has been detected, the fingerprint calculator 104 is able to calculate the sequence of reference fingerprints from the audio signal 100.

If the fingerprint calculator 104 obtains an audio signal 102 without block division information, the fingerprint calculator will select any block division and first performs block division. This block division is signalized to a block division information embedder 112 via block division information 110, which is implemented to embed the block division information 110 into the audio signal 102 without block division information. On the output side, the block division information embedder provides an audio signal 114 with block division information, wherein this audio signal can be output via an output interface 116, or can be stored separately or output via a different path independent from the output via the output interface 116, as is, for example, illustrated schematically at 118.

The fingerprint calculator 104 is implemented to calculate a sequence of reference audio signal fingerprint information 120. This sequence of reference audio signal fingerprint information is supplied to a fingerprint information embedder 122. The fingerprint information embedder embeds the reference audio signal fingerprint information 120 into multichannel extension data 124, which can be provided separately, or which can also be calculated directly by a multichannel extension data calculator 126, which receives a multichannel audio signal 128 on the input side. On the output side, the fingerprint information embedder 122 provides multichannel extension data with associated reference audio signal fingerprint information, wherein these data are designated by 130. The fingerprint information embedder 122 is implemented to embed the reference audio signal fingerprint information directly into the multichannel extension data, quasi at block level. Alternatively or additionally, the fingerprint information embedder 122 will also store or provide the sequence of reference audio signal fingerprint information based on the association with a block of multichannel extension data, wherein this block of multichannel extension data together with a block of the audio signal represents a fairly good approximation of a multichannel audio signal or the multichannel audio signal 128.

The output interface 116 is implemented to output an output signal 132 which comprises the sequence of reference audio signal fingerprint information and the multichannel extension data in unique association, such as within an embedded data stream. Alternatively, the output signal can also be a sequence of blocks of multichannel extension data without reference audio signal fingerprint information. The fingerprint information is then provided in a separate sequence of fingerprint information, wherein, for example, every fingerprint is "connected" to a block of multichannel extension data by means of a serial block number. Alternative associations of fingerprint data with blocks, such as via implicit signalization of a sequence, etc., can also be applied.

Further, the output signal 132 can also comprise an audio signal with block division information. In specific cases of application, such as in broadcasting, the audio signal with block division information will run along a separate path 118.

Figure 2:
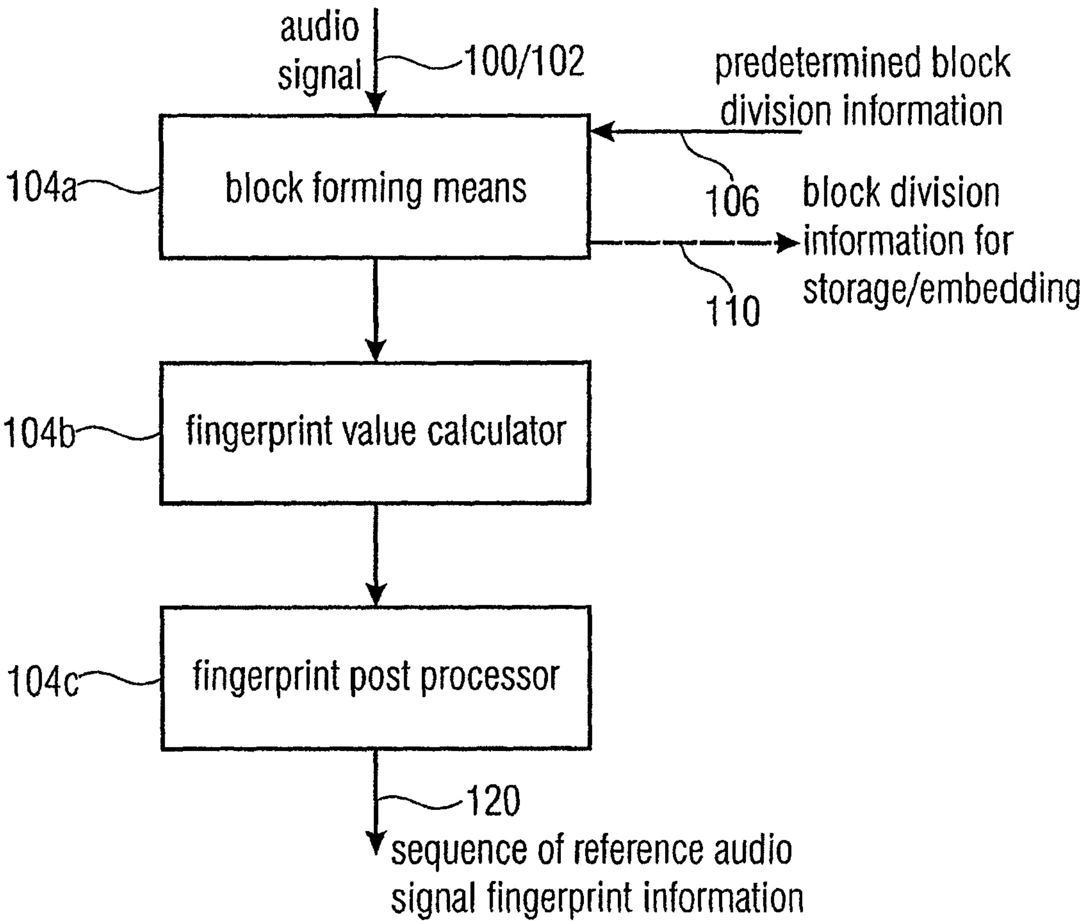
FIG. 2 is a detailed illustration of the fingerprint calculator of FIG. 1.

FIG. 2 shows a detailed illustration of the fingerprint calculator 104. In the embodiment shown in FIG. 2, the fingerprint calculator 104 comprises a block-forming means 104*a*, a downstream fingerprint calculator 104*b* and a fingerprint post-processor 104*c* for providing a sequence of reference audio signal fingerprint information 120. The block-forming means 104*a* is implemented to provide the block division information to storage/embedding 110 when the same actually performs first block formation. If, however, the audio signal already has block division information, the block forming means 104*a* will be controllable to perform block formation in dependence on the predetermined block division information 106.

Independent of the usage of block division information, a particularly good, characteristic and efficient fingerprint is obtained by an apparatus for calculating a fingerprint of an audio signal as, for example, illustrated in FIG. 2. The block forming means 104 represents a means for dividing the audio signal into subsequent blocks of samples. Further, the fingerprint value calculation 104*b* is effective as a means for calculating a first fingerprint value for a first block of the subsequent blocks and a second fingerprint value for a second block of the subsequent blocks.

Figure 3A:
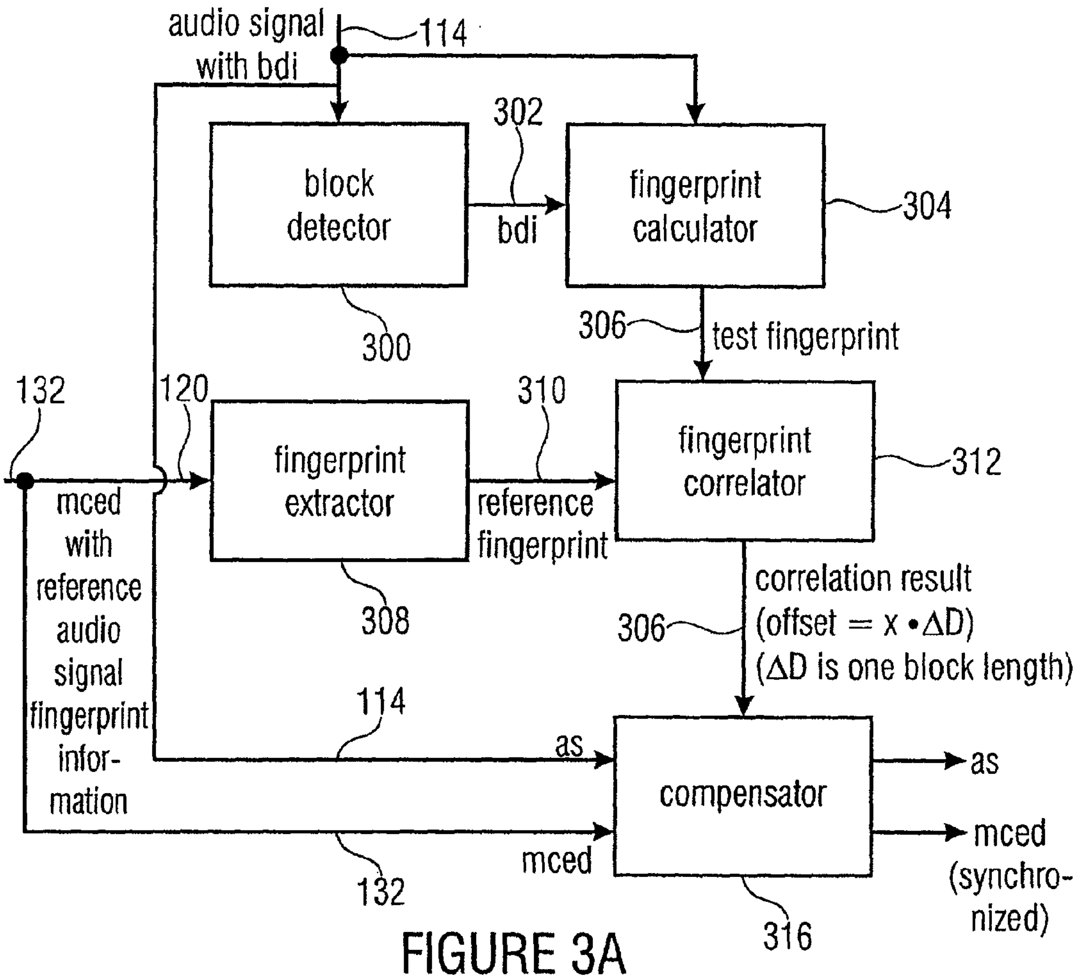
FIG. 3*a* is a block diagram of an apparatus for synchronizing according to an embodiment of the invention.
Figure 8:
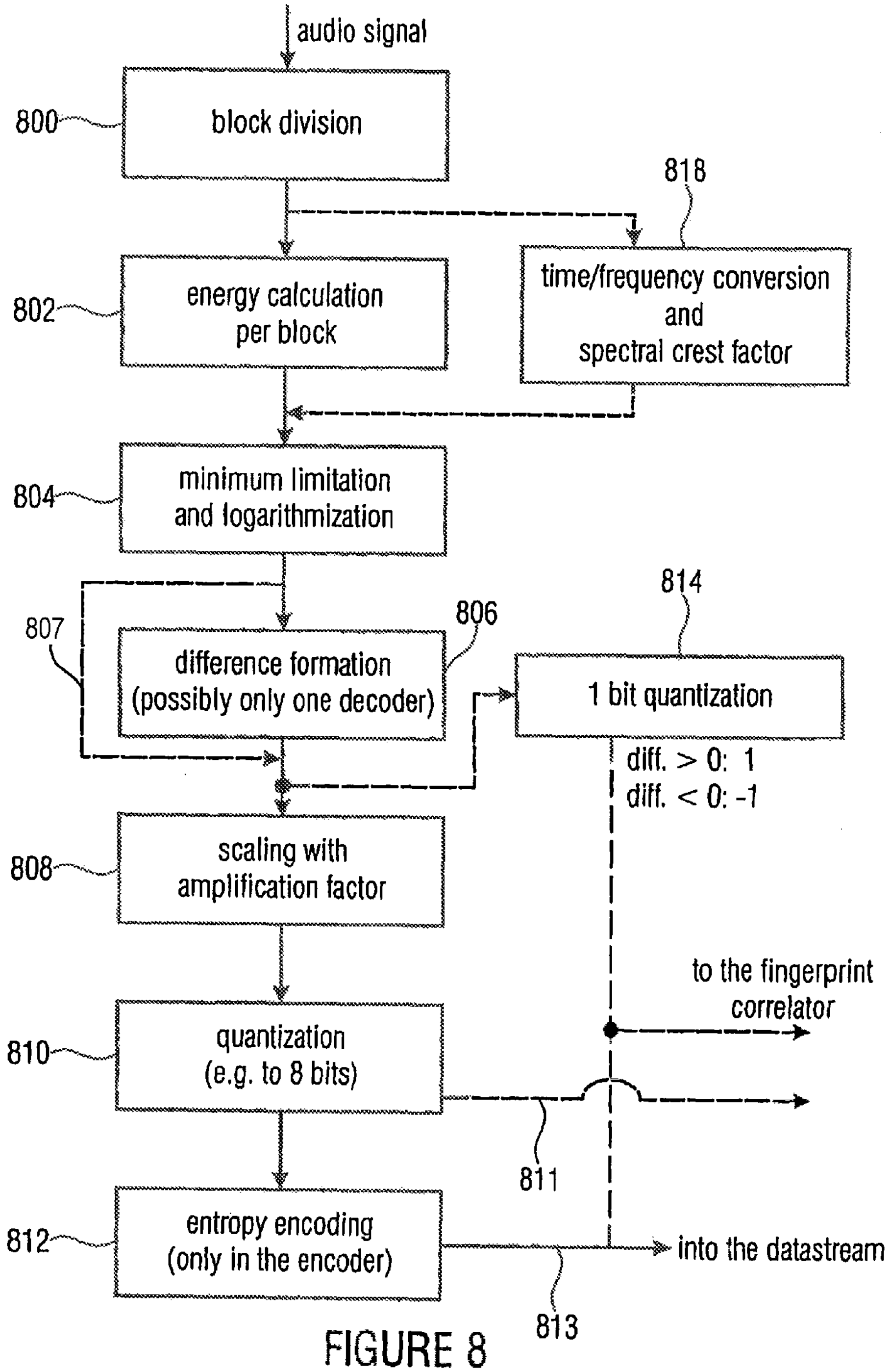
FIG. 8 is a flow diagram for illustrating different fingerprint calculation options.

The fingerprint correlator 312 of FIG. 3*a* represents a means for comparing, as illustrated at 806 in FIG. 8, wherein the first fingerprint value is compared to the second fingerprint value. An implementation of the means 806 for comparing consists in difference formation, as will be described based on FIG. 8, since then, based on the sign of the difference result, it can be determined whether the first fingerprint value was higher or smaller than the second fingerprint value.

The fingerprint postprocessor 104*c* of FIG. 2 is implemented according to the invention to perform a one-bit quantization 814, or generally to assign a first binary value, when the first fingerprint value is higher than the second fingerprint value, or to assign a second different binary value when the first fingerprint value is smaller than the second fingerprint value.

Finally, the inventive apparatus for calculating a fingerprint comprises a means for outputting information about a sequence of binary values as fingerprint for the audio signal, wherein the means can be implemented, for example, in the form of the output interface 116 of FIG. 1, or can operate as any other data stream or bit stream writer.

The two binary values, i.e. the first binary value and the second binary value, are complementary to each other. In the 1-bit quantization example (block 108, 114) shown in FIG. 8, the first binary value is, for example, 0 or 1, and the second binary value is also 0 or 1, wherein the second value is complementary to the first value. 1-bit quantization is performed, wherein exactly one bit is generated per block of the audio signal.

The sequence of bits as generated by block 814 is then the test fingerprint or the reference fingerprint.

The block dividing means 104*a* of FIG. 2 is implemented to either form successive adjacent blocks that are overlapping or to form blocks that are overlapping, which have, for example, 50% overlapping. Further, the block forming means 104*a* is implemented to provide blocks of the audio signal with time samples having at least 500 samples or more, and whose length is less than 5000 samples. Particularly advantageous, blocks in the range between 1000 and 2500 samples are used, wherein in particular when frequency-based measures are used for fingerprint value calculation, e.g. 1024 samples or 2048 samples are advantageous. The longer the blocks are selected, the lower the bit requirements of fingerprint information per audio signal will become. However, with increasing block length, the significance of the fingerprint is reduced, which is why the above described block lengths are advantageous, which can relate to an audio sampling frequency of, e.g. 44.1 KHz, wherein, however, respective block lengths for different sample rates also provide reasonable results as long as one block includes a time period of the audio signal of approx. 10 ms to approx. 100 ms.

The inventive fingerprint can be used for synchronization, as has been described based on FIG. 3, wherein an accuracy in the order of magnitude of one block length is obtained already without block division information, which can be increased to the range of one sample by adding the block division information. In cases of application where block-accurate synchronization is sufficient, a satisfying result can already be obtained without block division information. Also, with fingerprint applications for characterizing or identifying an audio signal, respectively, a sample-accurate synchronization between test fingerprint and reference fingerprint does not necessarily have to be obtained.

Figure 4A:
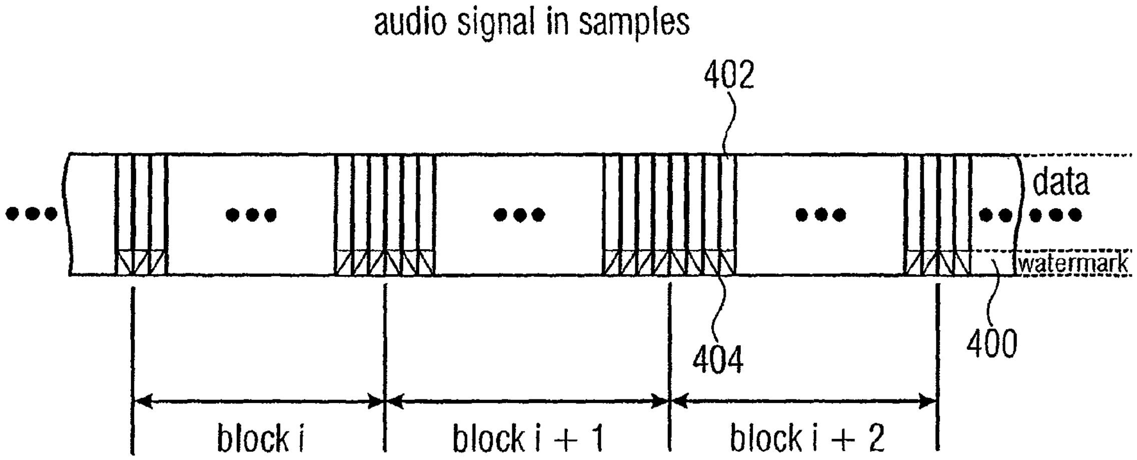
FIG. 4*a* is a schematic illustration of an audio signal with block division information.
Figure 5:
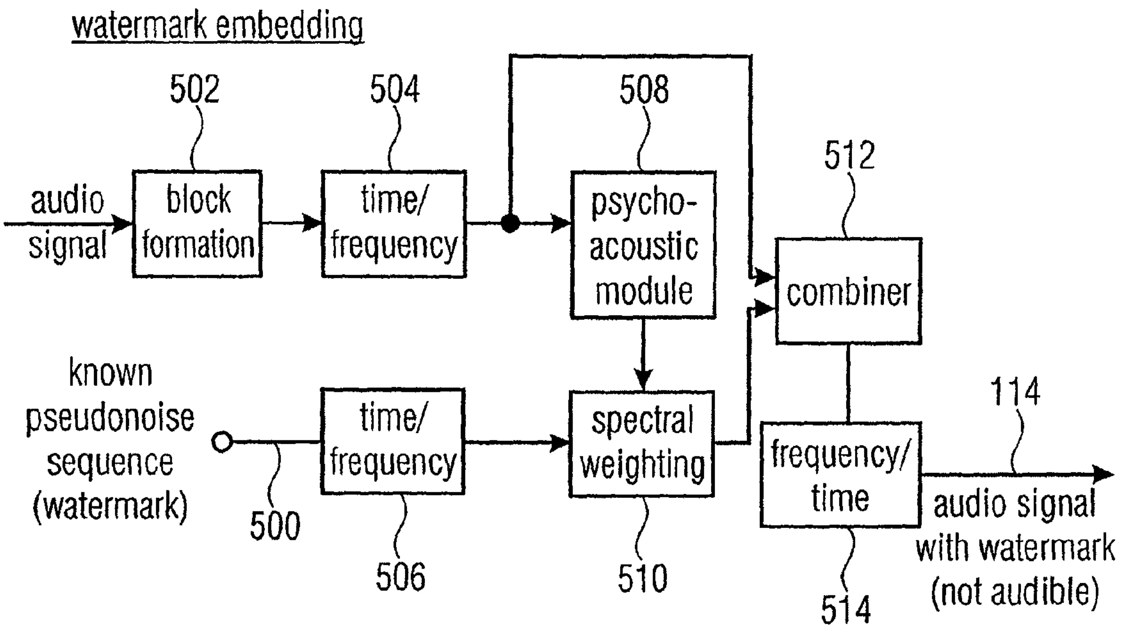
FIG. 5 is a schematic illustration of a watermark embedder for generating an audio signal with a watermark.

In one embodiment of the present invention, the audio signal is provided with a watermark, as is shown in FIG. 4*a*. In particular, FIG. 4*a* shows an audio signal having a sequence of samples, wherein a block division into blocks i, i+1, i+2 is indicated schematically. However, even in the embodiment shown in FIG. 4*a*, the audio signal itself does not include such an explicit block division. Instead, a watermark 400 is embedded in the audio signal such that every audio sample comprises a portion of the watermark. This portion of the watermark is automatically indicated at 404 for a sample 402. In particular, the watermark 400 is embedded such that the block structure can be detected based on the watermark. For this purpose, the watermark is, for example, a known periodic pseudo noise sequence, as is shown in FIG. 5 at 500. This known pseudo noise sequence has a period length equal to the block length or larger than a block length, wherein, however, a period length equal to the block length or in the order of magnitude of the block length is advantageous.

For watermark embedding, first, as is shown in FIG. 5, a block formation 502 of the audio signal is performed. Then, a block of the audio signal is converted to the frequency domain by means of a time/frequency conversion 504. Analogously, the known pseudo noise sequence 500 is transformed to the frequency domain by means of a time/frequency conversion 506. Thereupon, a psychoacoustic module 508 calculates the psychoacoustic masking threshold of the audio signal block, wherein, as known in psychoacoustics, a signal in a band will then be masked in the audio signal, i.e. the same is inaudible, when the energy of the signal in the band is below the value of the masking threshold for this band. Based on this information, a spectral weighting 510 for the spectral illustration of the pseudo noise sequence is performed. Then, prior to a combiner 512, the spectrally weighted pseudo noise sequence has a spectrum, which has a course corresponding to the psychoacoustic masking threshold. This signal is then combined, spectral value by spectral value, with the spectrum of the audio signal in the combiner 512. Hence, at the output of the combiner 512, an audio signal block with an introduced watermark exists, wherein, however, the watermark is masked by the audio signal. By a frequency/time converter 514, the block of the audio signal is converted back to the time domain and the audio signal shown in FIG. 4*a* exists, which now, however, has a watermark illustrating block division information.

It should be noted that many different watermark-embedding strategies exist. Hence, the spectral weighting 510 can be performed, for example, by a dual operation in the time domain, such that time/frequency conversion 506 is not necessitated.

Further, the spectrally weighted watermark could also be transformed into the time domain prior to its combination with the audio signal, such that the combination 512 takes place in the time domain, wherein in this case time/frequency conversion 504 would not absolutely be necessitated, as long as the masking threshold can be calculated without transformation. Obviously, calculation of the masking threshold used independently of the audio signal or of a transformation length of the audio signal, could also be performed.

The length of the known pseudo noise sequence is equal to the length of one block. Then, correlation for watermark extraction works particularly efficiently and clearly. However, longer pseudo noise sequences could be used, as long as a period length of the pseudo noise sequence is equal to or longer than the block length. Further, a watermark having no white spectrum can be used, which is merely implemented such that it comprises spectral portions in certain frequency bands, such as the lower spectral band or a central spectral band. Thereby, it can be controlled that the watermark is not, for example, introduced only in the upper bands which are eliminated or parameterized, for example, by a "spectral band replication" technique, as known from MPEG 4 standard, in a data rate-saving transmission.

As an alternative to using a watermark, block division can also be performed when, for example, a digital channel exists, where every block of the audio signal of FIG. 4 can be marked such that, for example, the first sample value of a block obtains a flag. Alternatively, for example, block division can be signalized in a header of an audio signal, which is used for the calculation of the fingerprint and which has also been used for calculating the multichannel extension data from the original multichannel audio channels.

Figure 9:
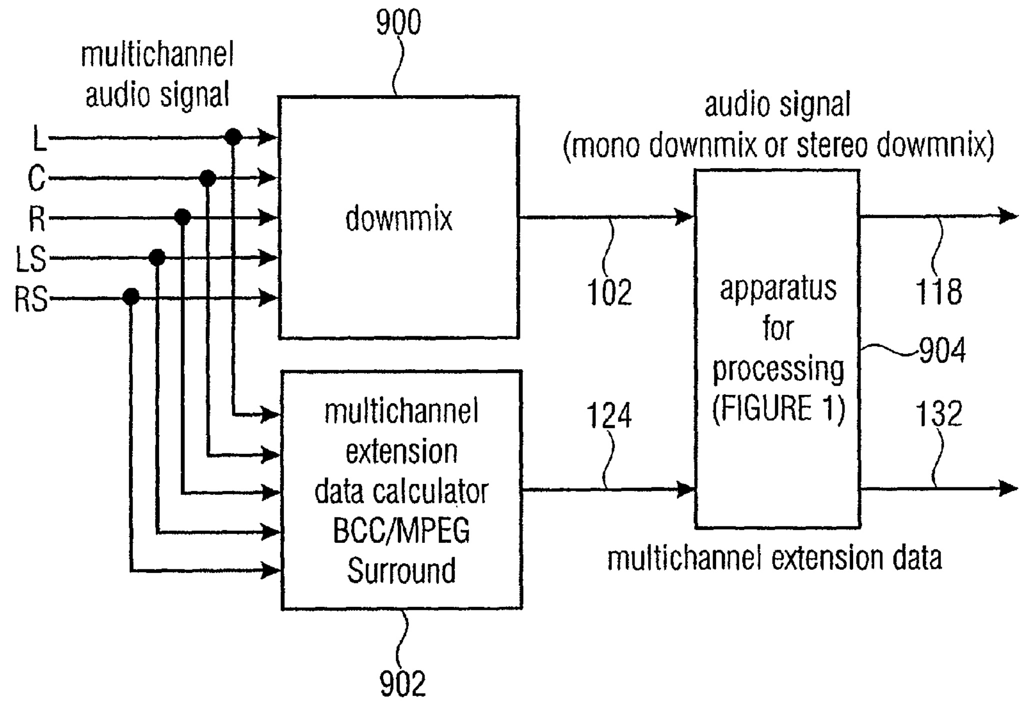
FIG. 9 is a multichannel encoder scenario with an inventive apparatus for processing.

For illustrating the scenario of calculating the multichannel extension data, reference will be made below to FIG. 9. FIG. 9 shows an encoder-side scenario, as it is used for reducing the data rate of multichannel audio signals. A 5.1 scenario is shown exemplarily, wherein, however, a 7.1, 3.0 or an alternative scenario can be used. For the spatial audio object coding, which is also known and where audio objects are coded instead of audio channels, where the multichannel extension data are actually data with which objects can be reconstructed, a basically binary structure, indicated in FIG. 9, is used. The multichannel audio signal having the several audio channels or audio objects is supplied to a downmixer 900 providing a downmix audio signal, wherein the audio signal is, for example, a mono downmix or a stereo downmix. Further, multichannel extension data calculation is performed in a respective multichannel extension data calculator 902. There, the multichannel extension data are calculated, e.g. according to the BCC technique or according to the standard known under the name MPEG surround. Extension data calculation for audio objects, which are also referred to as multichannel extension data, can also take place in the audio signal 102. The apparatus for processing the audio signal shown in FIG. 1 is downstream of these known two blocks 900, 902, wherein the apparatus 904 for processing shown in FIG. 9 receives, according to FIG. 1, for example an audio signal 102 without block division information as mono downmix or stereo downmix, and further receives the multichannel extension data via the line 124. Hence, the multichannel extension data calculator 126 of FIG. 1 will correspond to the multichannel extension data calculator 902 of FIG. 9. On the output side, the apparatus 904 for processing provides, for example, an audio signal 118 having embedded block division information as well as a data stream having multichannel extension data together with associated or embedded reference audio signal fingerprint information as illustrated in FIG. 1 at 132.

Figure 11A:
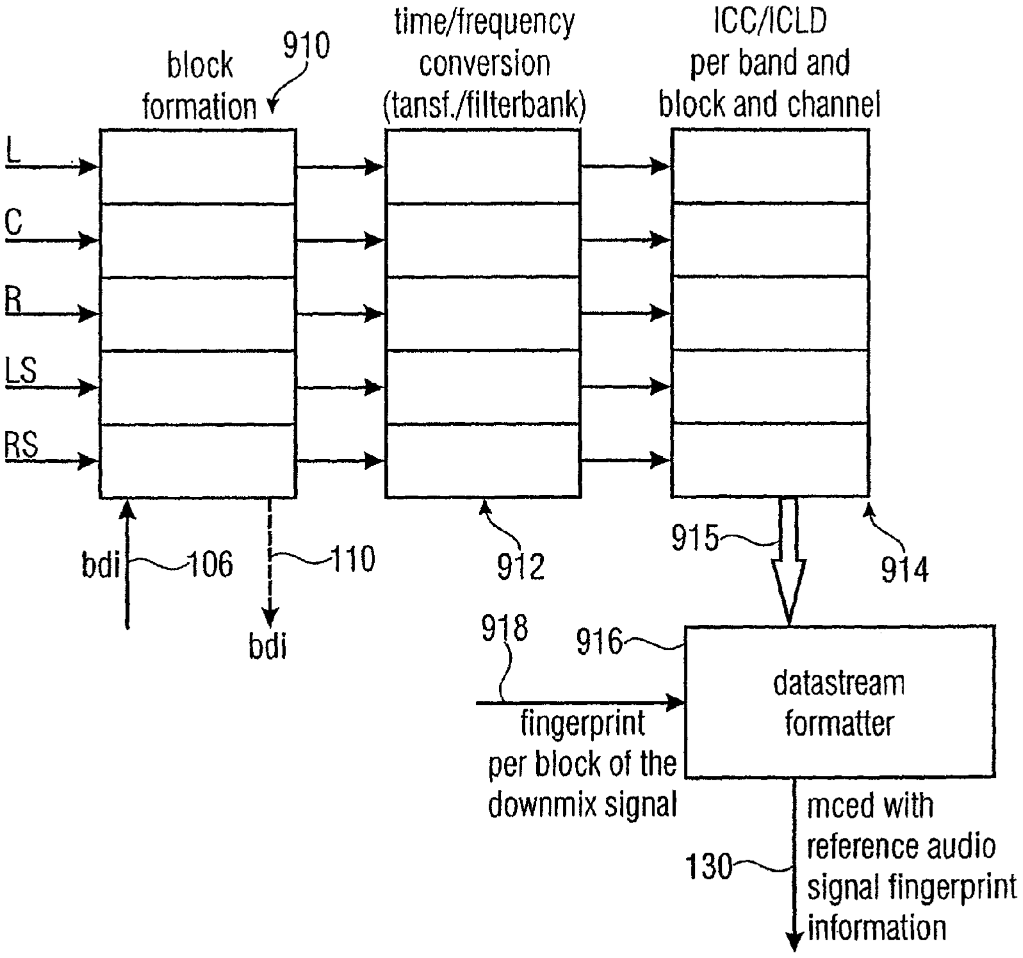
FIG. 11*a* is a detailed illustration of the multichannel extension data calculator of FIG. 9.

FIG. 11*a* shows a detailed illustration of the multichannel extension data calculator 902. In particular, first, block formation in respective block-forming means 910 is performed for obtaining a block for the original channel of the multichannel audio signal. Thereupon, time/frequency conversion in a time/frequency converter 912 is performed per block. The time/frequency converter can be a filter bank for performing sub-band filtering, a general transformation or in particular a transformation in the form of an FFT. Alternative transformations are also known as MDCT etc. Thereupon, an individual correlation parameter between the channel and the reference channel indicated by ICC is calculated in the multichannel extension data calculator per band, block and, for example, also per channel. Further, an individual energy parameter ICLD is calculated per band and block and channel, wherein this is performed in a parameter calculator 914. It should be noted that the block-forming means 910 uses block division information 106, when such block division information already exists. Alternatively, the block-forming means 910 can also determine block division information itself when the first block division is performed and then output the same and use it to control, for example, the fingerprint calculator of FIG. 1. Analogously to the designation in FIG. 1, the output block division information is also designated by 110. Generally, it is ensured that the block formation for calculating the multichannel extension data is performed in synchronization with the block formation for calculating the fingerprints of FIG. 1. Thereby it is ensured that a sample-exact synchronization of multichannel extension data to the audio signal is obtainable.

Figure 11B:
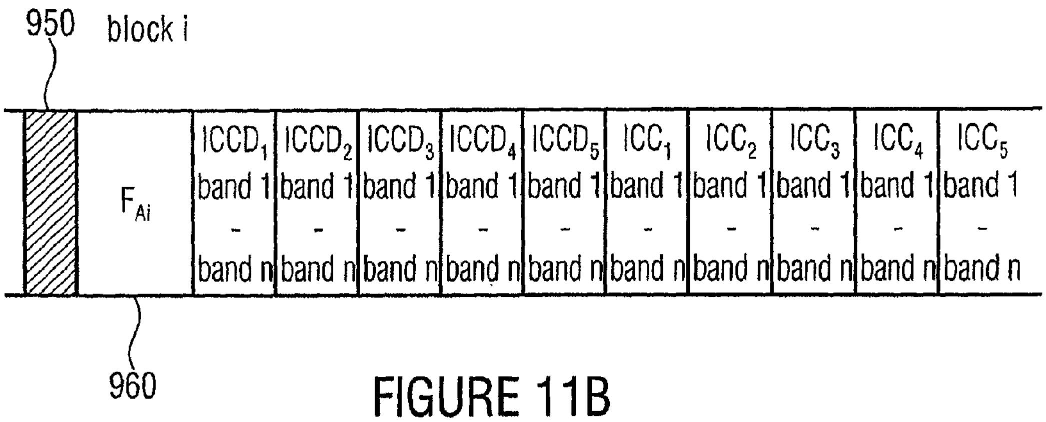
FIG. 11*b* is a detailed illustration of a block with multichannel extension data as can be generated by the arrangement shown in FIG. 11*a*.

The parameter data calculated by the parameter calculator 914 are supplied to a data stream formatter 916, which can be implemented equal to the fingerprint information embedder 122 of FIG. 1. Further, the data stream formatter 916 receives a fingerprint per block of the downmix signal as indicated at 918. Then, with the fingerprint and the received parameter data 915, the data stream formatter generates multichannel extension data 130 with embedded fingerprint information, one block of which is illustrated schematically in FIG. 11*b*. In particular, the fingerprint information for this block is entered after an optional present synchronization word 950 at 960. Then, after the fingerprint information 960, the parameters 915 follow which the parameter calculator 940 has calculated, namely, for example, in the sequence shown in FIG. 11*b* where first the ICLD parameters per channel and band occur, which are then followed by the ICC parameters per channel and band. The channel is in particular signalized by the index of "ICLD", wherein an index "1" stands, for example, for the left channel, an index "2" stands for the central channel, an index "3" stands for the right channel, an index "4" stands for the left rear channel (LS), and an index "5" stands for the right rear channel (RS).

Figure 4B:
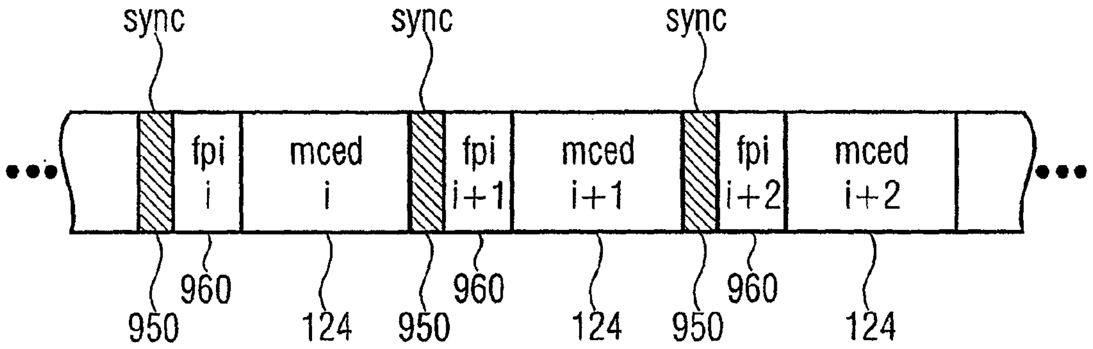
FIG. 4*b* is a schematic illustration of multichannel extension data with block-wise embedded fingerprints.

Generally this results in a data stream with multichannel extension data as illustrated in FIG. 4*b*, wherein the fingerprint of the audio signal, i.e. the stereo downmix signal or the mono downmix signal or generally the downmix signal, precedes the multichannel extension data 124 for a block. In one implementation, the fingerprint information for one block can also be inserted in the transmission direction after the multichannel extension data or somewhere between the multichannel extension data. Alternatively, the fingerprint information can also be transmitted in a separate data stream, or, for example, in a separate table which is, for example, associated with the multichannel extension data by means of an explicit block identificator, or where the association is implicitly given, namely by the order of the fingerprints in relation to the order of the multichannel extension data for the individual blocks. Other associations without explicit embedding can also be used.

FIG. 3*a* shows an apparatus for synchronizing multichannel extension data with an audio signal 114. In particular, the audio signal 114 includes block division information, as is illustrated based on FIG. 1. In addition to that, reference audio signal fingerprint information is associated with the multichannel extension data.

The audio signal with the block division information is supplied to a block detector 300, which is implemented to detect the block division information in the audio signal, and to supply the detected block division information 302 to a fingerprint calculator 304. Further, the fingerprint calculator 304 receives the audio signal, wherein here an audio signal without block division information would be sufficient, wherein, however, the fingerprint calculator can also be implemented to use the audio signal with block division information for fingerprint calculation.

Now, the fingerprint calculator 304 calculates one fingerprint per block of the audio signal for a plurality of subsequent blocks in order to obtain a sequence of test audio signal fingerprints 306. In particular, the fingerprint calculator 304 is implemented to use the block division information 302 for calculating the sequence of test audio signal fingerprints 306.

The inventive synchronization apparatus, or the inventive synchronization method, is further based on a fingerprint extractor 308 for extracting a sequence of reference audio signal fingerprints 310 from the reference audio signal fingerprint information 120 as it is supplied to the fingerprint extractor 308.

Both the sequence of test fingerprints 306 and the sequence of reference fingerprints 308 are supplied to a fingerprint correlator 312, which is implemented to correlate the two sequences. Depending on a correlation result 314, where an offset value is obtained, which is an integer (x) of the block length (ΔD), a compensator 316 is controlled for reducing, or, in the best case, eliminating a time offset between the multichannel extension data 132 and the audio signal 114. At the output of the compensator 316, both the audio signal and the multichannel extension data are output in a synchronized form in order to be supplied to multichannel reconstruction, as will be discussed with reference to FIG. 10.

Figure 10:
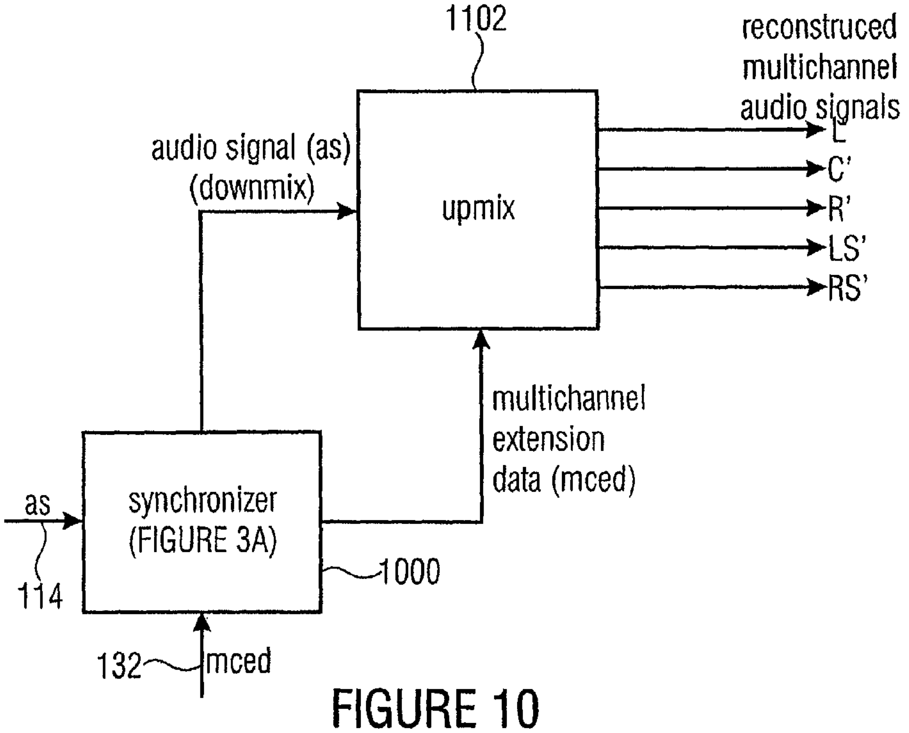
FIG. 10 is a multichannel decoder scenario with an inventive synchronizer.

The synchronizer shown in FIG. 3*a* is shown in FIG. 10 at 1000. As has been illustrated with reference to FIG. 3*a*, the synchronizer 1000 includes the audio signal 114 and the multichannel extension data in non-synchronized form and provides the audio signal and the multichannel extension data in synchronized form to an upmixer 1102 on the output side. The upmixer 1102, also referred to as an "upmix" block, can now calculate, based on the audio signal and the multichannel extension data synchronized thereto, reconstructed multichannel audio signals L', C', R', LS' and RS'. These reconstructed multichannel audio signals represent an approximation to the original multichannel audio signals, as they have been illustrated at the input of the block 900 in FIG. 9. Alternatively, the reconstructed multichannel audio signals at the output of block 1102 in FIG. 10 also represent reconstructed audio objects or reconstructed audio objects already amended at certain positions, as is known from audio object coding. Now, the reconstructed multichannel audio signals have a maximum obtainable audio quality, due to the fact that synchronization of the multichannel extension data has been obtained in a sample-exact manner with the audio signal.

Figure 3B:
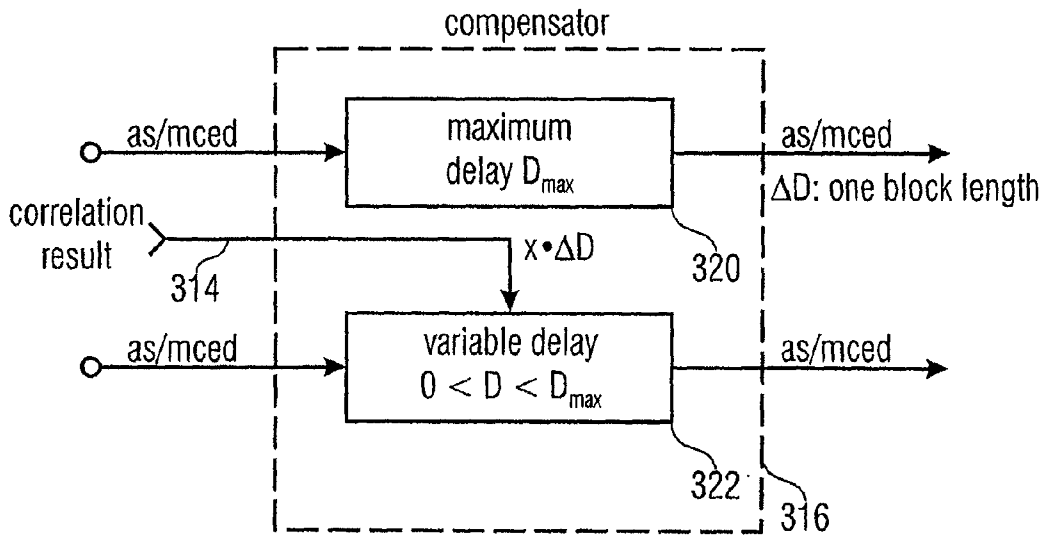
FIG. 3*b* is a detailed representation of the compensator or FIG. 3*a;*

FIG. 3*b* shows a specific implementation of the compensator 316. The compensator 316 has two delay blocks, of which one block 320 can be a fixed delay block having a maximum delay and the second block 322 can be a block having a variable delay that can be controlled between a delay equal to zero and a maximum delay $D_{max}$. Control takes place based on the correlation result 314. The fingerprint correlator 312 provides correlation offset control in integers (x) of one block length (Δd). Due to the fact that fingerprint calculation has been performed in the fingerprint calculator 304 itself based on the block division information included in the audio signal, according to the invention, sample-exact synchronization is obtained although the fingerprint correlator only had to perform block-based correlation. Despite the fact that the fingerprint has been calculated block by block, i.e. represents the time curve of the audio signal and correspondingly the time curve of the multichannel extension data only in a relatively coarse manner, a sample-exact correlation is nevertheless obtained, merely due to the fact that the block division of the fingerprint calculator 304 has been synchronized in the synchronizer with regard to the block division that has been used for calculating the multichannel extension data block by block and which has, above all, been used for calculating the fingerprints embedded in the multichannel extension data stream or associated with the multichannel extension data stream.

With regard to the implementation of the compensator 316, it should be noted that also two variable delays can be used, such that the correlation result 314 controls both variable delay stages. Also, alternative implementation options within a compensator for synchronization purposes can be used for eliminating time offsets.

In the following, with reference to FIG. 6, a detailed implementation of the block detector 300 of FIG. 3*a* will be illustrated, when the block division information is introduced into the audio signal as a watermark. The watermark extractor in FIG. 6 can be structured analogously to the watermark embedder of FIG. 5, but it does not have to be structured in an exactly analogous manner.

Figure 6:
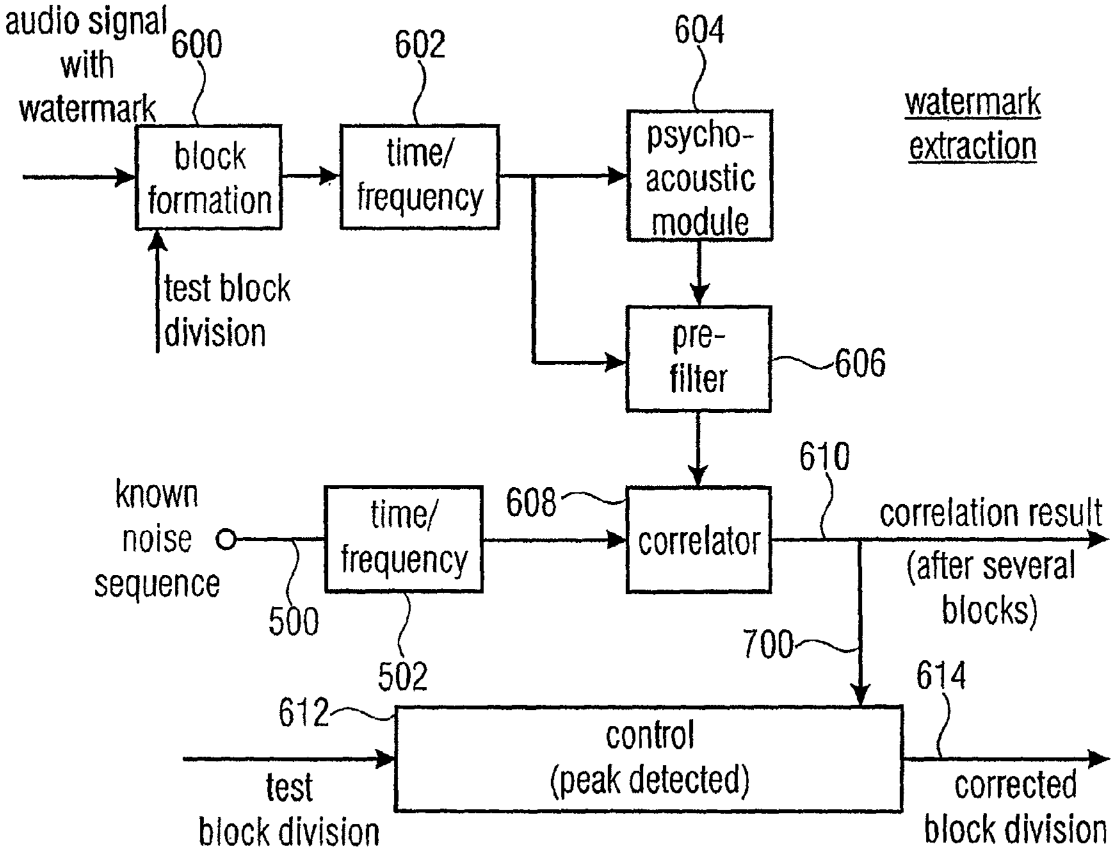
FIG. 6 is a schematic illustration of a watermark extractor for extracting block division information.

In the embodiment shown in FIG. 6, the audio signal with watermark is supplied to a block former 600, which generates subsequent blocks from the audio signal. One block is then supplied to a time/frequency converter 602 for transforming the block. Based on the spectral representation of the block or due to a separate calculation, a psychoacoustic module 604 is able to calculate a masking threshold for subjecting the block of the audio signal to prefiltering in a prefilter 606 by using this masking threshold. The implementation of the module 604 and the prefilter 606 serve to increase the detection accuracy for the watermark. The same can also be omitted, such that the output of the time/frequency converter 602 is directly coupled to a correlator 608. The correlator 608 is implemented to correlate the known pseudo noise sequence 500, which has already been used in the watermark embedding in FIG. 5, after a time/frequency conversion in a converter 502 to a block of the audio signal.

Figure 7:
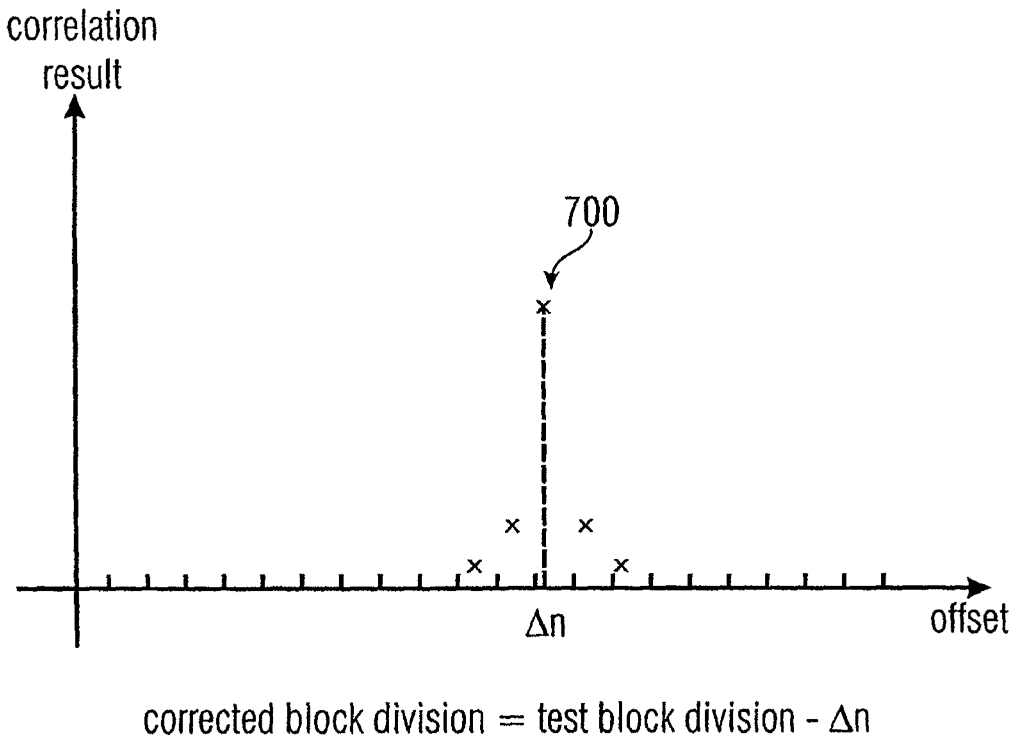
FIG. 7 is a schematic illustration of a result diagram as it appears after correlation across, e.g., 30 blocks of the test block division.

For block formation in the block 600, a test block division is predetermined that does not necessarily have to correspond to the final block division. Instead, the correlator 608 will now perform correlation across several blocks, for example across twenty or even more blocks. Thereby, the spectrum of the known noise sequence is correlated with the spectrum of every block at different delay values in the correlator 608, such that a correlation result 610 results after several blocks, which could, for example, look like it is shown in FIG. 7. A control 612 can monitor the correlation result 610 and perform peak detection. For that purpose, the control 612 detects a peak 700 becoming more and more apparent with a larger number of blocks used for correlation. As soon as a correlation peak 700 is detected, merely the x coordinate, i.e. the offset Δn, has to be determined, where the correlation result has shown. In an embodiment of the present invention, this offset Δn indicates the number of samples by which the test block division has deviated from the block division actually used in the watermark embedding. From this knowledge about the test block division and the correlation result 700, the control 612 now determines a corrected block division 614, e.g. according to the formula shown in FIG. 7. In particular, the offset value Δn is subtracted from the test block division for calculating the corrected block division 614, which is then to be maintained by the fingerprint calculator 304 of FIG. 3*a* for calculating the test fingerprints.

Regarding the exemplary watermark extractor in FIG. 6, it should be noted that an extraction can also be performed alternatively, e.g. in the time domain and not in the frequency domain, that prefiltering can also be omitted, and that alternative ways can be used for calculating the delay, i.e. the sample offset value Δn. An alternative option is, for example, to test several test block divisions and to use the test block division providing the best correlation result either after one or after several blocks. Also, non-periodic watermarks can be used as correlation measures, i.e. non-periodic sequences, which could be even shorter than one block length.

Hence, for solving the association problem, a specific procedure on the transmitter side and the receiver side is advantageous in an embodiment of the present invention. On the transmitter side, calculation of time-variable and appropriate fingerprint information from the corresponding (mono or stereo) downmix audio signal can be performed. Further, these fingerprints can be entered regularly into the transmitted multichannel additional data stream as a synchronization help. This can be performed as a data field within the spatial audio coding side information organized block by block, or in such a manner that the fingerprint signal is transmitted as first or last information of the data block in order to be easily added or removed. Further, a watermark, such as a known noise sequence, can be embedded into the audio signal to be transmitted. This helps the receiver to determine the frame phase and to eliminate a frame-internal offset.

On the receiver side, two-stage synchronization is advantageous. In a first stage, the watermark is extracted from the received audio signal and the position of the noise sequence is determined. Further, the frame boundaries can be determined due to their noise sequence by the position and the audio data stream can be divided correspondingly. Within these frame boundaries, or block boundaries, the characteristic audio features, i.e. fingerprints, can be calculated across almost equal portions, as were calculated within the transmitter, which increases the quality of the result at a later correlation. In a second stage, time-variable and appropriate fingerprint information is calculated from the corresponding stereo audio signal or mono audio signal, or, generally, from the downmix signal, wherein the downmix signal can also have more than two channels, as long as the channels in the downmix signal have a smaller number than there are channels or generally audio objects in the original audio signal prior to the downmix.

Further, the fingerprints can be extracted from the multichannel additional information and a time offset between the multichannel additional information and the received signal can be performed by means of appropriate and also known correlation methods. An overall time offset consists of the frame phase and the offset between the multichannel additional information and the received audio signal. Further, the audio signal and the multichannel additional information can be synchronized for subsequent multichannel decoding by a downstream actively regulated delay compensation stage.

For obtaining the multichannel additional data, the multichannel audio signal is divided, for example into blocks of a fixed size. In the respective block, a noise sequence also known to the receiver is embedded, or, generally, a watermark is embedded. In the same raster, a fingerprint is calculated block by block simultaneously or at least synchronized for obtaining the multichannel additional data, which is suitable for characterizing the time structure of the signal as clearly as possible.

One embodiment for this is using the energy content of the current downmix audio signal of the audio block, for example in a logarithmic form, i.e. in a decibel-related representation. In this case, the fingerprint is a measure for the time envelope of the audio signal. For reducing the information amount to be transmitted, and for increasing the accuracy of the measurement value, this synchronization information can also be expressed as difference to the energy value of the previous block with subsequent appropriate entropy coding, such as a Huffman coding, adaptive scaling and quantization.

With reference to FIG. 8 and generally with reference to FIG. 2, embodiments for calculating a fingerprint will be discussed below.

After a block division in a block dividing step 800, the audio signal is present in subsequent blocks. Thereupon, fingerprint value calculation is performed according to block 104*b* of FIG. 2, wherein the fingerprint value can, for example, be one energy value per block, as illustrated in a step 802. When the audio signal is a stereo audio signal, energy calculation of the downmix audio signal in the current block is performed according to the following equation:

$$E_{mono\,sum} = \sum_{i=0}^{1152} S_{left}(i)^2 + S_{right}(i)^2$$

In particular, the signal value $s_{left}(i)$ with the number i represents a time sample of a left channel of the audio signal. $s_{right}(i)$ is the $i^{th}$ sample of a right channel of the audio signal. In the shown embodiment, the block length is 1152 audio samples, which is why the 1153 audio samples (including the sample for i=0) both from the left and the right downmix channel are each squared and summed. If the audio signal is a monophonic audio signal, the summation is omitted. If the audio signal is a signal with, for example, three channels, the squared samples from three channels will be summed up. Further, it is advantageous to remove the (non-meaningful) steady components of the downmix audio signals prior to calculation.

In a step 804, a minimum limitation of the energy is performed due to subsequent logarithmic representation. For a decibel-related evaluation of the energy, a minimum energy offset $E_{offset}$ is provided, so that a useful logarithmic calculation results in the case of zero energy. This energy measure in dB describes a number range of 0 to 90 (dB) at an audio signal resolution of 16 bits. Hence, in a block 804, the following equation will be implemented:

$$E^{(db)}=10\log(E_{monosum}+E_{offset})$$

For an exact determination of the time offset between the multichannel additional information and the received audio signal, not the absolute energy level value is used, but rather the slope or steepness of the signal envelope. Therefore, for correlation measurement in the fingerprint correlator 312 of FIG. 3*a*, the steepness of the energy envelope is used. Technically speaking, this signal deviation is calculated by a difference formation of the energy value with that of the previous block, according to the following equation:

$$E_{db(diff)}=E_{db}(\text{current\_block})E_{db}(\text{previous\_block})$$

$E_{db(dif)}$ is the difference value of the energy values of two previous blocks, in a dB representation, while $E_{db}$ is the energy in dB of the current block or the previous block, as it is obvious from the above equation. This difference formation of energies is performed in a step 806.

It should be noted that this step is performed, for example, only in the encoder, i.e. in the fingerprint calculator 104 of FIG. 1, such that the fingerprint embedded in the multichannel extension data consists of difference coded values.

Alternatively, step 806 of the difference formation can also be implemented purely on the decoder side, i.e. in the fingerprint calculator 304 of FIG. 3*a*. In this case, the transmitted fingerprint only consists of non-difference coded fingerprints, and the difference formation according to step 806 is only performed within the decoder. This option is represented by the dotted signal flow line 807, which bridges the difference formation block 806. This latter option 808 has the advantage that the fingerprint still includes information about the absolute energy of the downmix signal, but necessitates a slightly higher fingerprint word length.

While blocks 802, 804, 806 belong to fingerprint value calculation according to 104*b* of FIG. 2, the subsequent steps 808 (scaling with amplification factor), 810 (quantization), 812 (entropy coding) or also 1-bit quantization are counted in block 814 belong to fingerprint post-processing according to the fingerprint post-processor 104*c*.

When scaling the energy (envelope of the signal) for optimal modulation according to block 808, it is ensured that in the subsequent quantization of this fingerprint both the number range is utilized maximally and also the resolution at low energy values is improved. Therefore, additional scaling or amplification is introduced. The same can be realized either as a fixed or static weighting amount or via a dynamic amplification regulation adapted to the envelope signal. Combinations of a static weighting amount as well as an adapted dynamic amplification regulation can also be used. In particular, the following equation is followed:

$$E_{scaled}=E_{db(diff)}*A_{amplification}(t)$$

$E_{scaled}$ represents the scaled energy. $E_{db(diff)}$ represents the difference energy in dB calculated by the difference formation in block 806, and $A_{amplification}$ is the amplification factor, which can depend on the time t when it is a particularly dynamic amplification regulation. The amplification factor will depend on the envelope signal in that the amplification factor becomes smaller with a larger envelope and the amplification factor becomes higher with a smaller envelope in order to obtain a modulation of the available number range that is as uniform as possible. The amplification factor can be reproduced in particular in the fingerprint calculator 304 by measuring the energy of the transmitted audio signal, so that the amplification factor does not have to be transmitted explicitly.

In a block 810, the fingerprint calculated by block 808 is quantized. This is performed in order to prepare the fingerprint for entering into the multichannel additional information. This reduced fingerprint resolution has shown to be a good tradeoff with regard to bit requirement and reliability of the delay detection. In particular overruns of >255 can be limited to the maximum value of 255 with a saturation characteristic curve, as can be illustrated, for example, in an equation as below:

$$E_{quantized} = Q_{8bits}\left[\text{Saturation}\frac{255}{0}(E_{scaled})\right]$$

$E_{quantized}$ is the quantized energy value and represents a quantization index having 8 bits. $Q_{8bits}$ is the quantization operation assigning the quantization index for the maximum value 255 to a value of >255. It should be noted that finer quantizations with more than 8 bits or coarser quantizations with less than 8 bits can also be used, wherein the additional bit requirements decrease with coarser quantization, while the additional bit requirements increase with finer quantization with more bits, but the accuracy increases as well.

Thereupon, in a block 812, entropy coding of the fingerprint can take place. By evaluating statistical characteristics of the fingerprint, the bit requirements for the quantized fingerprint can be reduced further. An appropriate entropy method is, for example, Huffman coding. Statistically different frequencies of fingerprint values can be expressed by different code lengths, and can thus, on average, reduce the bit requirements for fingerprint illustration.

The result of the entropy coding block 812 will then be written into the extension channel data stream, as is illustrated at 813. Alternatively, non-entropy coded fingerprints can be written into the bit stream as quantized values, as is illustrated at 811.

As an alternative to the energy calculation per block in step 802, a different fingerprint value can be calculated, as is illustrated in block 818.

As an alternative to the energy of a block, the crest factor of the power density spectrum (PSD crest) can be calculated. The crest factor is generally calculated as the quotient between the maximum value XMax of the signal in a block to the arithmetic average of the signals $X_n$ (e.g. spectral values) in the block, as is illustrated exemplarily in the following equation $$y = \frac{X\text{Max}}{\frac{\sum_{i=1}^{n} X_n}{n}}$$

Further, another method can be used in order to obtain a more robust synchronization. Instead of post-processing by means of blocks 808, 810, 812, 1-bit quantization can be used as an alternative fingerprint post-processing 104*c* (FIG. 2), as is illustrated in block 814. Here, additionally, 1-bit quantization is performed directly after the calculation and the difference formation of the fingerprint according to 802 or 818 in the encoder. It has been shown that this can increase the accuracy of the correlation. This 1-bit quantization is realized such that the fingerprint equals 1 when the new value is higher than the old one (slope positive) and equals −1 when the slope is negative. A negative slope is achieved when the new value is smaller than the old value.

The inventive 1-bit quantization simplifies the correlations calculation in the fingerprint correlator 312 significantly. Based on the fact that the test fingerprint and the reference fingerprint are bit sequences, the correlation can be simplified to a simple XOR operation and subsequently summing up the bit-by-bit results of the XOR operation. Hence, when the sequence of tests audio signal fingerprint values and the sequence of reference audio signal fingerprints each are a sequence of 1 bit values, wherein 1 bit each stands for a block of audio samples, the fingerprint correlator 312 of FIG. 3*a* is implemented to combine a bit sequence of the sequence of test audio signal fingerprints and a bit sequence of the reference audio signal fingerprints by a bit-by-bit XOR operation and to sum up obtained bit results. The result of this summation represents a first correlation value. The bit sequences have a length of, e.g. 32 bits or between e.g. 10 bits and 100 bits.

Further, the fingerprint correlator 312 is implemented to combine a bit sequence of a sequence of test audio signal fingerprints or reference audio signal fingerprints offset by an offset-value with a respectively different sequence, also by bit-by-bit XOR operation and to sum up the obtained bit results, which results in a second correlation value. For the offset value, for which the maximum correlation value was given, it can be determined that test fingerprint and reference fingerprint have matched. Hence, this offset value represents the correlation result, since the highest correlation value has been given for this specific offset value.

In addition to improving the synchronization results, this quantization also has an effect on the bandwidth for transmitting the fingerprint. While previously at least 8 bits had to be introduced for the fingerprint for providing a sufficiently accurate value, here, a single bit is sufficient. Since the fingerprint and its 1-bit counterpart are already determined in the transmitter, a more accurate calculation of the difference is obtained since the actual fingerprint is present with maximum resolution and thus even minimum changes between the fingerprints can be considered both in the transmitter and in the receiver. Further, it has been found out that most subsequent fingerprints only differ minimally. This difference, however, will be eliminated by quantization prior to difference formation.

Depending on the implementation and when block-by-block accuracy is sufficient, the 1-bit quantization can be used as the specific fingerprint post-processing even independent of whether an audio signal with additional information is present or not, since the 1-bit quantization based on difference coding is already a robust and still accurate fingerprint method in itself, which can also be used for purposes other than synchronization, e.g. for the purpose of identification or classification.

As has been illustrated based on FIG. 11*a*, a calculation of the multichannel additional data is performed with the help of the multichannel audio data. The calculated multichannel additional information is subsequently extended by newly added synchronization information in the form of the calculated fingerprints by appropriate embedding into the bit stream.

The wordmark fingerprint hybrid solution allows a synchronizer to detect a time offset of downmix signal and additional data and to realize a time-correct adaptation, i.e. delay compensation between the audio signal and the multichannel extension data in the order of magnitude of +/− one sample value. Therewith, the multichannel association is reconstructed almost completely in the receiver, i.e. apart from a hardly noticeable time difference of several samples, which does not have a noticeable effect on the quality of the reconstructed multichannel audio signal.

The inventive fingerprint as calculated, for example, by a fingerprint calculator 104 or the fingerprint calculator 304 with or without a block division information, can be used for characterizing a test audio signal. Therefore, means 104 or 304, respectively, is provided in order to obtain a sequence of test audio fingerprints from the test audio signal.

Further, a correlator, such as the correlator 312 is provided in order to correlate the sequence of binary values with different reference fingerprints provided in a reference database, wherein the reference database comprises, for every reference fingerprint, information about an audio signal associated with the reference fingerprint.

Based on these different correlations, which means based on the correlation of the test audio signal fingerprint in sequence of a 1-bit frequency and the different reference fingerprints of the reference database, information about the test audio signal can be reached.

Information about the test audio signal is, for example, an identification of the audio signal, for example the name of the piece and possibly the author, on what CD or which sound carrier this piece can be found, and where it can be ordered. An alternative characterization of an audio signal is to identify a test audio signal for example as audio signal of a specific stylistic period or a specific style, or to identify the same as being from a certain band. Such a characterization can be made, for example, by determining not only qualitatively, but also quantitatively how the reference fingerprint relates to the test fingerprint or which distance exists between the two. This matching of fingerprint sequences or calculating the quantitive distance of fingerprint sequences, respectively, can take place, for example, when a correlation has taken place in order to eliminate the time offset of the reference fingerprint and the test fingerprint.

Depending on the circumstances, the inventive method can be implemented in hardware or in software. The implementation can be made on a digital storage medium, in particular a disc, CD or DVD with electronically readable control signals that can cooperate with a programmable computer system such that the method is performed. Hence, generally, the invention also consists of a computer program product having a program code stored on a machine-readable carrier for performing the inventive method when the computer program product runs on a computer. In other words, the invention can be realized as a computer program having a program code for performing the method when the computer program runs on a computer.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An apparatus for synchronizing multichannel extension data with an audio signal, wherein the multichannel extension data are associated with reference audio signal fingerprint information comprising:

a fingerprint calculator for calculating a fingerprint of the audiosignal comprising:

a divider for dividing the audio signal into subsequent blocks of samples;

a calculator for calculating a first fingerprint value for a first block of the subsequent blocks and a second fingerprint value for a second block of the subsequent blocks;

a comparator for comparing the first fingerprint value with the second fingerprint value;

an assigner for assigning a first binary value when the first fingerprint value is higher than the second fingerprint value, or a second different binary value when the first fingerprint value is smaller than the second fingerprint value; and an outputter for outputting information about a sequence of binary values as a sequence of test audio, signal fingerprints for the audio signal;

a fingerprint extractor for extracting a sequence of reference audio signal fingerprints from the reference audio signal fingerprint information associated with the multichannel extension data;

wherein the sequence of test audio signal fingerprints and the sequence of reference audio signal fingerprints are each a sequence of 1-bit values, wherein one bit each is associated with one block of audio samples, a fingerprint correlator for correlating the sequence of test audio signal fingerprints and the sequence of reference audio signal fingerprints, wherein the fingerprint correlator is implemented to combine a bit sequence of the sequence of test audio signal fingerprints and a bit sequence of the reference audio signal fingerprints by a bit-by-bit XOR operation, and to sum up acquired bit results in order to acquire a first correlation value, to further combine a bit sequence of the sequence of test audio signal fingerprints or the reference audio signal fingerprints shifted by an offset value with a respectively different sequence by a bit-by-bit XOR operation, and to sum up acquired bit results in order to acquire a second correlation value, and to select that offset value as the correlation result for which the largest correlation value has resulted; and a compensator for reducing or eliminating a time offset between the multichannel extension data and the audio signal based on the correlation result.

2. The apparatus according to claim 1, wherein the assigner is implemented to take a binary value that is complementary to the first binary value as a second different value.

3. The apparatus according to claim 2, wherein the first binary value and the second binary value are exactly one bit.

4. The apparatus according to claim 3, wherein the assigner is implemented to assign a first bit value as first binary value and a second bit value complementary to the first value as second different value.

5. The apparatus according to claim 1, wherein the outputter is implemented to output a sequence of bits as the sequence of test audio signal fingerprints.

6. The apparatus according to claim 1, wherein the comparator is implemented to calculate a difference between the first fingerprint value and the second fingerprint value; and wherein the assigner is implemented to assign the first binary value when the difference is more than 0 and to assign the second binary value when the difference is less than 0.

7. The apparatus according to claim 1, wherein the divider is implemented to provide adjacent or overlapping blocks as subsequent blocks.

8. The apparatus according to claim 1, wherein the calculator is implemented to calculate an energy or power-dependent amount of the block as first or second fingerprint value.

9. The apparatus according to claim 1, wherein the calculator is implemented to square and sum up time samples per block in order to acquire the first or second fingerprint value for the block.

10. The apparatus according to claim 1, wherein the calculator is implemented to calculate a crest factor of a power spectrum of the block as first or second fingerprint value.

11. An apparatus for characterizing a test audio signal, comprising:

a calculator for calculating a test fingerprint, of the test audio signal comprising:

a divider for dividing the audio signal into subsequent blocks of samples;

a calculator for calculating a first fingerprint value for a first block of the subsequent blocks and a second fingerprint value for a second block of the subsequent blocks;

a comparator for comparing the first fingerprint value with the second fingerprint value;

an assigner for assigning a first binary value when the first fingerprint value is higher than the second fingerprint value, or a second different binary value when the first fingerprint value is smaller than the second fingerprint value; and an outputter for outputting information about a sequence of binary values as a sequence of test audio signal fingerprints for the audio signal;

a correlator for correlating the information about the sequence of binary values with different reference fingerprints in a reference database, wherein the reference database comprises information about an audio signal for every reference fingerprint, which is associated to the reference fingerprint; and wherein the sequence of test audio signal fingerprints and the sequence of reference audio signal fingerprints are each a sequence of 1-bit values, wherein one bit each is associated with one block of audio samples, wherein the correlator is implemented to combine a bit sequence of the sequence of test audio signal fingerprints and a bit sequence of the reference audio signal fingerprints by a bit-by-bit XOR operation, and to sum up acquired bit results in order to acquire a first correlation value, to further combine a bit sequence of the sequence of test audio signal fingerprints or the reference audio signal fingerprints shifted by an offset value with a respectively different sequence by a bit-by-bit XOR operation, and to sum up acquired bit results in order to acquire a second correlation value, and to select that offset value as the correlation result for which the largest correlation value has resulted, a provider for providing information about the test audio signal based on the correlation result.

12. A method for synchronizing multichannel extension data with an audio signal, wherein the multichannel extension data are associated with the reference audio signal fingerprint information, comprising:

calculating a fingerprint of an audio signal, comprising:

dividing the audio signal into subsequent blocks of samples;

calculating a first fingerprint value for a first block of the subsequent blocks and a second fingerprint value for a second block of the subsequent blocks;

comparing the first fingerprint value with the second fingerprint value;

assigning a first binary value when the first fingerprint value is higher than the second fingerprint value, or a second different binary value when the first fingerprint value is smaller than the second fingerprint value; and outputting information about a sequence of binary values as a sequence of test audio signal fingerprints for the audio signal;

extracting a sequence of reference audio signal fingerprints from the reference audio signal fingerprint information associated with the multichannel extension data;

wherein the sequence of test audio signal fingerprints and the sequence of reference audio signal fingerprints are each a sequence of 1-bit values, wherein one bit each is associated with one block of audio samples, correlating the sequence of test audio signal fingerprints and the sequence of reference audio signal fingerprints, the correlating comprising combining a bit sequence of the sequence of test audio signal fingerprints and a bit sequence of the reference audio signal fingerprints by a bit-by-bit XOR operation, and to sum up acquired bit results in order to acquire a first correlation value, combining a bit sequence of the sequence of test audio signal fingerprints or the reference audio signal fingerprints shifted by an offset value with a respectively different sequence by a bit-by-bit XOR operation, and to sum up acquired bit results in order to acquire a second correlation value, and selecting that offset value as the correlation result for which the largest correlation value has resulted; and reducing or eliminating a time offset between the multichannel extension data and the audio signal based on the correlation result.

13. A method for characterizing a test audio signal, comprising:

calculating a test fingerprint of an audio signal, comprising:

dividing the audio signal into subsequent blocks of samples;

calculating a first fingerprint value for a first block of the subsequent blocks and a second fingerprint value for a second block of the subsequent blocks;

comparing the first fingerprint value with the second fingerprint value;

assigning a first binary value when the first fingerprint value is higher than the second fingerprint value, or a second different binary value when the first fingerprint value is smaller than the second fingerprint value; and outputting information about a sequence of binary values as a sequence of test audio signal fingerprints for the audio signal, wherein a sequence of binary values is acquired as test fingerprint;

wherein the sequence of test audio signal fingerprints and the sequence of reference audio signal fingerprints are each a sequence of 1-bit values, wherein one bit each is associated with one block of audio samples, correlating the information about a sequence of binary values with different reference fingerprints in a reference database, wherein the reference database comprises, for every reference finger print, information about an audio signal associated with the reference fingerprint, the correlating comprising:

combining a bit sequence of the sequence of test audio signal fingerprints and a hit sequence of the reference audio signal fingerprints by a bit-by-bit XOR operation, and to sum up acquired bit results in order to acquire a first correlation value, combining a bit sequence of the sequence of test audio signal fingerprints or the reference audio signal fingerprints shifted by an offset value with a respectively different sequence by a bit-by-bit XOR operation, and to sum up acquired bit results in order to acquire a second correlation value, and selecting that offset value as the correlation result for which the largest correlation value has resulted; and providing information about the test audio signal based on the correlation result.

14. A computer program comprising a program code for performing the method for synchronizing multichannel extension data with an audio signal, wherein the multichannel extension data are associated with the reference audio signal fingerprint information, the method comprising:

calculating a fingerprint of an audio signal, comprising:

dividing the audio signal into subsequent blocks of samples;

calculating a first fingerprint value for a first block of the subsequent blocks and a second fingerprint value for a second block of the subsequent blocks;

comparing the first fingerprint value with the second fingerprint value;

assigning a first binary value when the first fingerprint value is higher than the second fingerprint value, or a second different binary value when the first fingerprint value is smaller than the second fingerprint value; and outputting information about a sequence of binary values as a sequence of test audio signal fingerprints for the audio signal;

extracting a sequence of reference audio signal fingerprints from the reference audio signal fingerprint information associated with the multichannel extension data;

wherein the sequence of test audio signal fingerprints and the sequence of reference audio signal fingerprints are each a sequence of 1-bit values, wherein one bit each is associated with one block of audio samples, correlating the sequence of test audio signal fingerprints and the sequence of reference audio signal fingerprints, the correlating comprising combining a bit sequence of the sequence of test audio signal fingerprints and a bit sequence of the reference audio signal fingerprints by a bit-by-bit XOR operation, and to sum up acquired bit results in order to acquire a first correlation value, combining a bit sequence of the sequence of test audio signal fingerprints or the reference audio signal fingerprints shifted by an offset value with a respectively different sequence by a bit-by-bit XOR operation, and to sum up acquired bit results in order to acquire a second correlation value, and selecting that offset value as the correlation result for which the largest correlation value has resulted; and reducing or eliminating a time offset between the multichannel extension data and the audio signal based on the correlation result, when the program runs on a computer.

15. A non-transitory computer readable medium with computer program encoded thereon, the computer program comprising a program code for performing the method for characterizing a test audio signal, the method comprising:

calculating a test fingerprint of an audio signal, comprising:

dividing the audio signal into subsequent blocks of samples;

calculating a first fingerprint value for a first block of the subsequent blocks and a second fingerprint value for a second block of the subsequent blocks;

comparing the first fingerprint value with the second fingerprint value;

assigning a first binary value when the first fingerprint value is higher than the second fingerprint value, or a second different binary value when the first fingerprint value is smaller than the second fingerprint value; and outputting information about a sequence of binary values as a sequence of test audio signal fingerprints for the audio signal, wherein a sequence of binary values is acquired as test fingerprint;

wherein the sequence of test audio signal fingerprints and the sequence of reference audio signal fingerprints are each a sequence of 1-bit values, wherein one bit each is associated with one block of audio samples, correlating the information about a sequence of binary values with different reference fingerprints in a reference database, wherein the reference database comprises, for every reference fingerprint, information about an audio signal associated with the reference fingerprint, the correlating comprising:

combining a bit sequence of the sequence of test audio signal fingerprints and a bit sequence of the reference audio signal fingerprints by a bit-by-bit XOR operation, and to sum up acquired bit results in order to acquire a first correlation value, combining a bit sequence of the sequence of test audio signal fingerprints or the reference audio signal fingerprints shifted by an offset value with a respectively different sequence by a bit-by-hit XOR operation, and to sum up acquired bit results in order to acquire a second correlation value, and selecting that offset value as the correlation result for which the largest correlation value has resulted; and providing information about the test audio signal based on the correlation result, when the program runs on a computer.

* * * * *

UNITED STATES PATENT AND TRADEMARK OFFICE

CERTIFICATE OF CORRECTION

PATENT NO. : 8,634,946 B2
APPLICATION NO. : 12/867460
DATED : January 21, 2014
INVENTOR(S) : Scharrer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 714 days.

Signed and Sealed this
Twenty-second Day of September, 2015

Michelle K. Lee

Michelle K. Lee
*Director of the United States Patent and Trademark Office*